(12) United States Patent
Miyoshi

(10) Patent No.: US 11,172,091 B2
(45) Date of Patent: Nov. 9, 2021

(54) PHOTOELECTRIC CONVERSION DEVICE, LINE SENSOR, IMAGE READING DEVICE AND IMAGE FORMING APPARATUS

(71) Applicant: Yuuya Miyoshi, Osaka (JP)

(72) Inventor: Yuuya Miyoshi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/912,879

(22) Filed: Jun. 26, 2020

(65) Prior Publication Data
US 2021/0006682 A1 Jan. 7, 2021

(30) Foreign Application Priority Data
Jul. 1, 2019 (JP) .............................. JP2019-123239

(51) Int. Cl.
*H04N 1/03* (2006.01)
*H03M 1/12* (2006.01)

(52) U.S. Cl.
CPC ................ *H04N 1/03* (2013.01); *H03M 1/12* (2013.01)

(58) Field of Classification Search
None
See application file for complete search history.

(56) References Cited

U.S. PATENT DOCUMENTS

| | | | |
|---|---|---|---|
| 6,026,418 A * | 2/2000 | Duncan, Jr. .............. | G06F 17/10 324/76.21 |
| 6,362,770 B1 * | 3/2002 | Miller .................. | H03M 1/1225 327/553 |
| 7,400,283 B1 * | 7/2008 | Zhu ...................... | H03M 1/1225 341/122 |
| 7,414,555 B1 * | 8/2008 | Nathawad ........... | H03M 1/1215 341/122 |
| 8,570,417 B2 * | 10/2013 | Oike ..................... | H04N 5/3741 348/308 |
| 2003/0043089 A1 * | 3/2003 | Hanson ................ | H04N 5/3742 345/55 |
| 2004/0101208 A1 * | 5/2004 | Hopkins ................. | G06T 5/002 382/275 |
| 2005/0024251 A1 * | 2/2005 | Harada ............... | H03M 1/1225 341/163 |
| 2005/0046715 A1 * | 3/2005 | Lim ..................... | H04N 5/3532 348/294 |
| 2006/0023264 A1 * | 2/2006 | Chung ................... | H04N 1/207 358/448 |

(Continued)

FOREIGN PATENT DOCUMENTS

JP 2010-245955 10/2010

*Primary Examiner* — Ted W Barnes
(74) *Attorney, Agent, or Firm* — IPUSA, PLLC

(57) ABSTRACT

A photoelectric conversion device includes a plurality of pixels configured to output analog voltage signals in response to incident light; an analog memory configured to store the analog voltage signals output from the plurality of pixels; and an analog/digital (A/D) converter configured to perform A/D conversion on the analog voltage signal from the analog memory. The plurality of pixels includes N pixels configured to simultaneously output analog voltage signals to the analog memory. The A/D converter includes (N−1) or less A/D converters configured to perform A/D conversion on the analog voltage signals that have been simultaneously output from the N pixels and stored in the analog memory.

12 Claims, 16 Drawing Sheets

(56) References Cited

U.S. PATENT DOCUMENTS

| | | | |
|---|---|---|---|
| 2006/0050162 A1* | 3/2006 | Nakamura | H04N 5/335 348/308 |
| 2010/0283643 A1* | 11/2010 | Byrne | H03M 1/1225 341/122 |
| 2013/0162870 A1 | 6/2013 | Miyoshi et al. | |
| 2014/0022354 A1* | 1/2014 | Okigawa | H04N 5/347 348/46 |
| 2015/0163378 A1* | 6/2015 | Konno | H04N 5/369 358/483 |
| 2015/0372691 A1* | 12/2015 | Mandal | H03M 1/38 341/110 |
| 2016/0112626 A1* | 4/2016 | Shimada | H04N 9/04515 348/349 |
| 2016/0344403 A1* | 11/2016 | Sonnaillon | H02M 3/157 |
| 2016/0358958 A1* | 12/2016 | Miyoshi | H04N 5/37452 |
| 2017/0171483 A1 | 6/2017 | Kudoh et al. | |
| 2017/0244844 A1* | 8/2017 | Miyoshi | H04N 1/00907 |
| 2017/0264844 A1 | 9/2017 | Kamezawa et al. | |
| 2017/0272742 A1 | 9/2017 | Suzuki et al. | |
| 2018/0063457 A1* | 3/2018 | Shimamura | H04N 5/3698 |
| 2018/0249107 A1 | 8/2018 | Kamezawa et al. | |
| 2018/0367749 A1* | 12/2018 | Miyoshi | H01L 27/146 |
| 2019/0028665 A1* | 1/2019 | Miyoshi | H04N 5/3575 |
| 2019/0208149 A1* | 7/2019 | Asaba | H04N 5/374 |
| 2019/0268496 A1* | 8/2019 | Nakazawa | H04N 5/37457 |
| 2019/0281247 A1* | 9/2019 | Jung | H04N 5/3742 |
| 2019/0319632 A1* | 10/2019 | Lee | H03M 1/0678 |
| 2019/0342513 A1* | 11/2019 | Doege | H04N 5/3456 |
| 2019/0393252 A1 | 12/2019 | Miyoshi et al. | |

\* cited by examiner

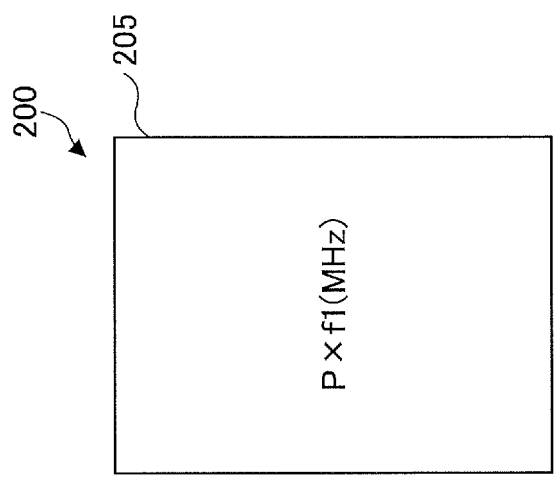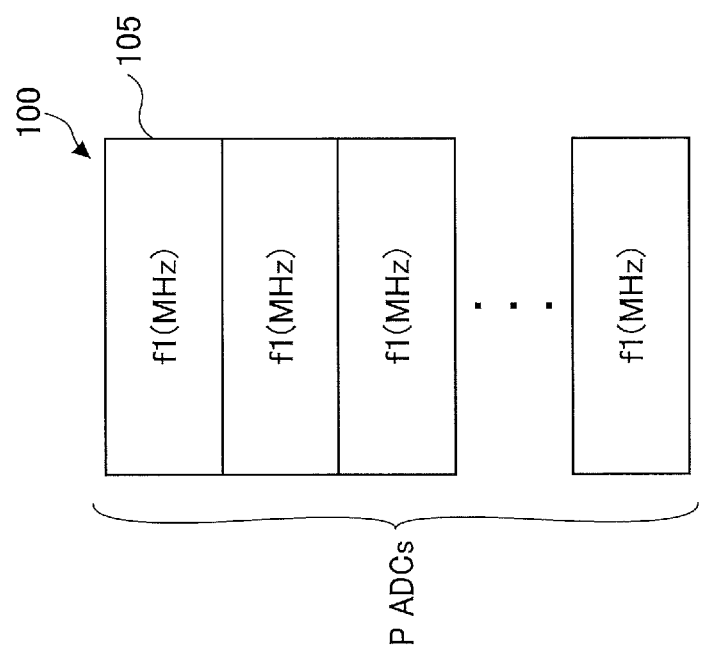

FIG. 4
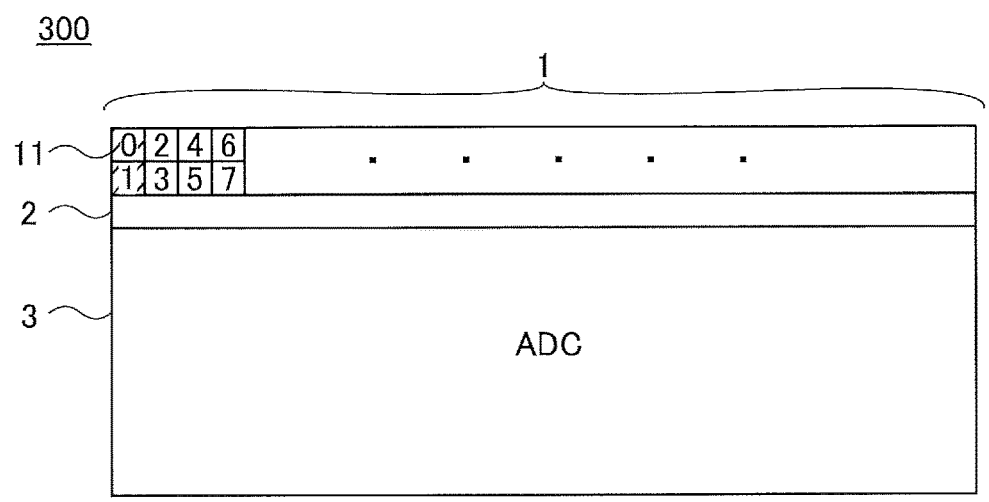
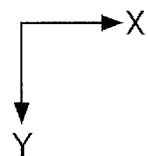
FIG. 5
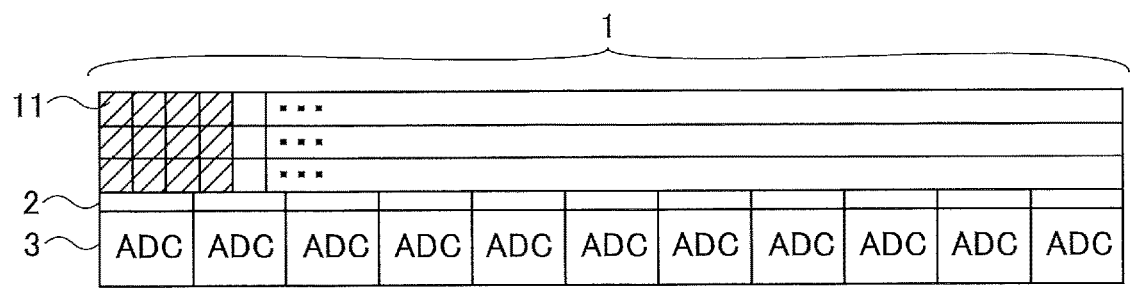
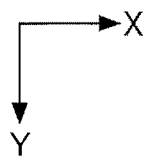

FIG. 6A
RELATED ART
FIG. 6B
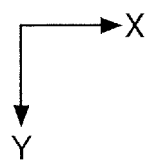
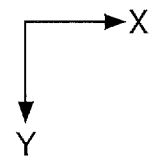

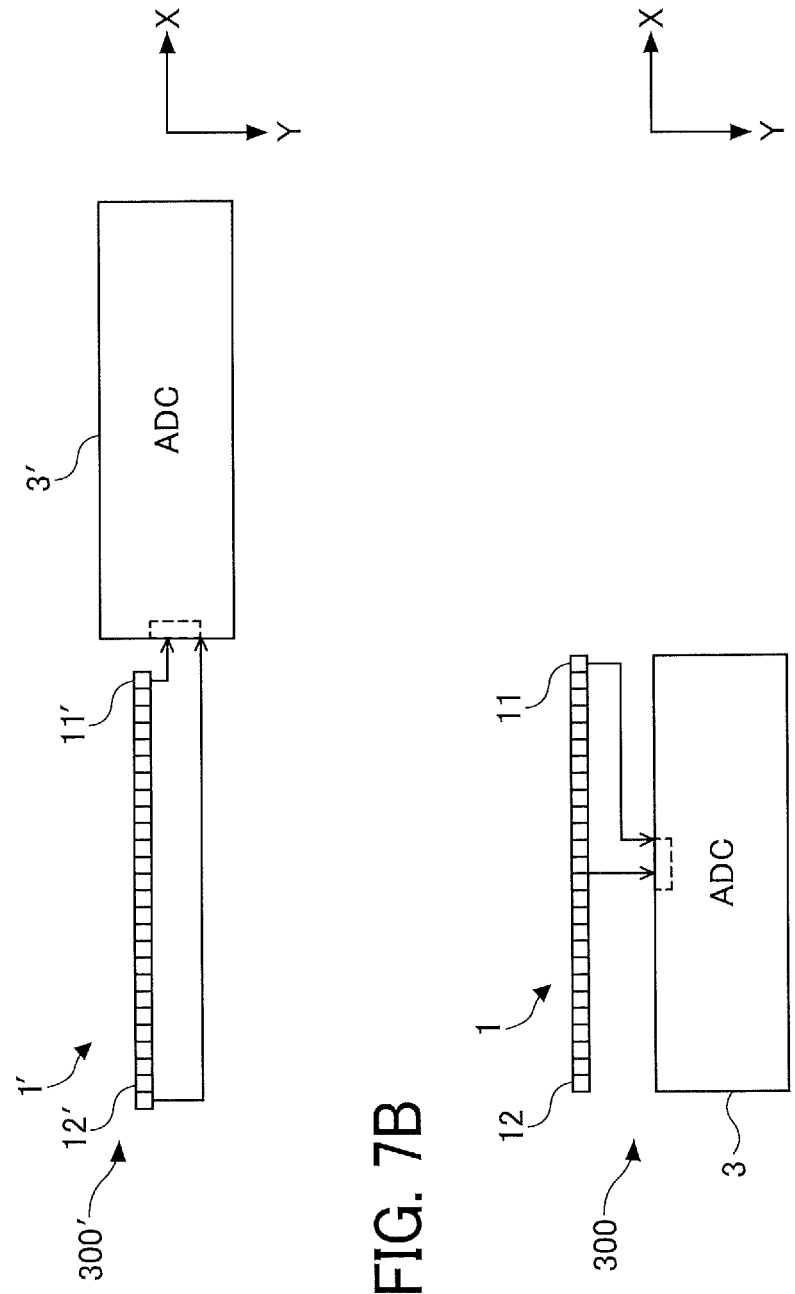

PHOTOELECTRIC CONVERSION DEVICE, LINE SENSOR, IMAGE READING DEVICE AND IMAGE FORMING APPARATUS

CROSS-REFERENCE TO RELATED APPLICATIONS

This patent application is based on and claims priority pursuant to 35 U.S.C. § 119(a) to Japanese Patent Application No. 2019-123239, filed on Jul. 1, 2019, in the Japan Patent Office, the entire disclosure of which is hereby incorporated by reference herein.

BACKGROUND

Technical Field

Embodiments of the present disclosure relate to a photoelectric conversion device, a line sensor, an image reading device, and an image forming apparatus.

Related Art

Photoelectric conversion devices are known that amplify photoelectrically-converted analog voltage signals and output analog-to-digital (A/D) signals.

SUMMARY

In one aspect of this disclosure, there is described a photoelectric conversion device including a plurality of pixels configured to output analog voltage signals in response to incident light; an analog memory configured to store the analog voltage signals output from the plurality of pixels; and an analog/digital (A/D) converter configured to perform A/D conversion on the analog voltage signal from the analog memory. The plurality of pixels includes N pixels configured to simultaneously output analog voltage signals to the analog memory. The A/D converter includes (N−1) or less A/D converters configured to perform A/D conversion on the analog voltage signals that have been simultaneously output from the N pixels and stored in the analog memory.

In another aspect of this disclosure, there is described a line sensor including the above-described photoelectric conversion device.

In still another aspect of this disclosure, there is described an image reading device including the above-described photoelectric conversion device.

Further described is an image forming apparatus including the above-described photoelectric conversion device.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein:

FIGS. 1A and 1B are illustrations for describing the relation of the number of analog digital converters (ADC) and the area of the ADC, FIG. 1A illustrating a case in which the number of ADCs is P and FIG. 1B illustrating a case in which one ADC is used;

FIG. 4 is an illustration of an example of the arrangement of the elements of the photoelectric conversion device according to the first embodiment;

FIG. 5 is an illustration of another example of the arrangement of the elements of the photoelectric conversion device according to the first embodiment;

FIGS. 6A and 6B are illustrations of the order in which a voltage signal is output in each pixel block, FIG. 6A illustrating a case of a photoelectric conversion device according to a comparative example and FIG. 6B illustrating a case of the photoelectric conversion device according to an embodiment of the present disclosure;

FIGS. 7A and 7B are illustrations of examples of the arrangement of the ADC, FIG. 7A illustrating a case of a photoelectric conversion device according to a comparative example and FIG. 7B illustrating a case of the photoelectric conversion device according to an embodiment of the present disclosure;

Figure 2:
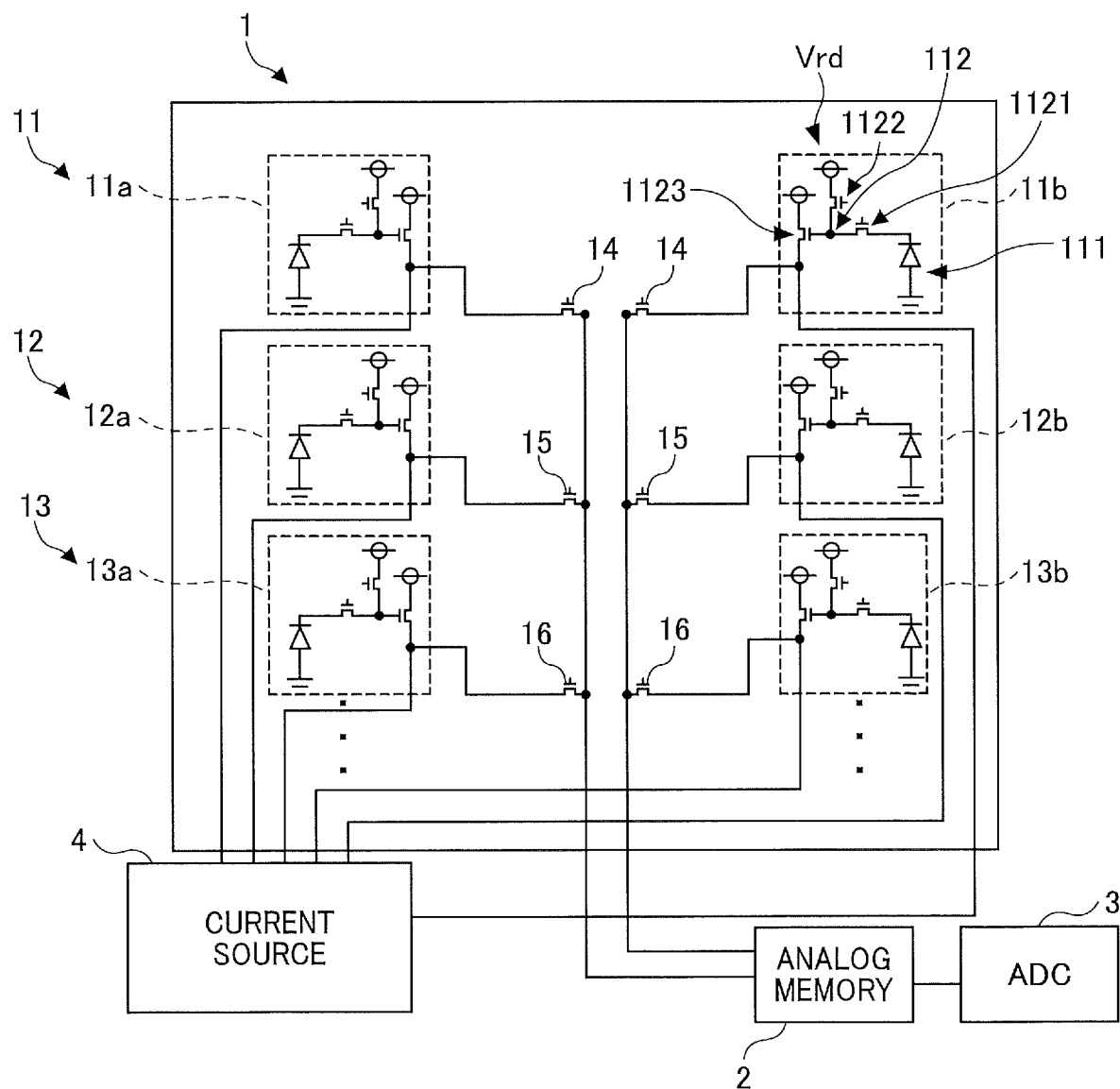
FIG. 2 is an illustration of an example of a configuration of a photoelectric conversion device according to the first embodiment.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Embodiments of the present disclosure are described below with reference to the drawings. In the drawings, like reference signs denote like elements, and overlapping description may be omitted.

In the embodiments, the photoelectric conversion device temporarily stores, in an analog memory, an analog voltage signal output from each of the plurality of pixels in response to incident light. Accordingly, the analog voltage signals, which are simultaneously output from N pixels of the plurality of pixels, can be converted from analog to digital using N−1 or less ADCs.

FIGS. 1A and 1B are illustrations for describing the relation of the number of ADCs and the area of the ADC in the photoelectric conversion device 100, FIG. 1A illustrating a case in which the number of ADCs is P and FIG. 1B illustrating a case in which one ADC is used.

In FIG. 1A, the photoelectric conversion device 100 includes P ADCs 105. When the conversion speed of A/D conversion in each ADC 105 is $f_1$ (MHz), the conversion speed of the A/D conversion in the entire photoelectric conversion device 100 is P×$f_1$ (MHz).

As illustrated in FIG. 1B, the photoelectric conversion device 200 includes one ADC 205. When the conversion speed of A/D conversion in the ADC 205 is P×$f_1$ (MHz), the conversion speed of A/D conversion in the entire photoelectric conversion device 200 is equal to the conversion speed of the photoelectric conversion device 100.

In view of this, by increasing the conversion speed of each one of the ADCs, reducing the number of the ADCs, and sharing the element and wiring between the ADCs, the conversion speed of A/D conversion needed for the operation of the photoelectric conversion device while reducing the area of the photoelectric conversion device.

The configuration of a photoelectric conversion device 300 according to the first embodiment is described with reference to FIG. 2. FIG. 2 is a circuit diagram of an example of the photoelectric conversion device 300. As illustrated in FIG. 2, the photoelectric conversion device 300 includes a photoelectric conversion unit 1, an analog memory 2, an ADC 3, and a current source 4.

The photoelectric conversion unit 1 also includes a pixel block 11 including pixels 11a and 11b, a pixel block 12 including pixels 12a and 12b, a pixel block 13 including pixels 13a and 13b, and selecting switches 14 to 16.

Each of the pixel blocks 11 to 13 simultaneously outputs an analog voltage signal of each of the two pixels to the analog memory 2. More specifically, when the selecting switch 14 is turned on, the pixel block 11 outputs the analog voltage signals of the pixels 11a and 11b to the analog memory 2 simultaneously. When the selecting switch 15 is turned on, the pixel block 12 outputs the analog voltage signals of the pixels 12a and 12b to the analog memory 2 simultaneously. When the selecting switch 16 is turned on, the pixel block 13 outputs the analog voltage signals of the pixels 13a and 13b to the analog memory 2 simultaneously.

Each of the pixel blocks 11 to 13 is an example of N pixels. In the example of FIG. 2, N is 2 (N=2). Also, each of the pixels 13a and 13b simultaneously outputs an analog voltage signal to the analog memory 2, which is called rolling of the two pixels. In other words, simultaneous outputting of the analog voltage signals from N pixels is referred to as rolling of N pixels.

Next, the configuration of a pixel included in each of the pixel blocks 11 to 13 is described with reference to the pixel 11b in FIG. 2. As illustrated in FIG. 2, the pixel 11b includes a photo diode (PD) 111 and a front diffusion (FD) region 112.

The PD 111 is a photosensor to output electric charges in response to light striking the PD 111. The anode of the PD 111 is connected to the ground voltage, and the cathode of the PD 111 is electrically connected to one end of the transfer transistor 1121 in the FD region 112.

The FD region 112 converts the electric charges from the PD 111 into a voltage. Further, the FD region 112 includes a transfer transistor 1121, a reset transistor 1122, and an amplifier transistor 1123.

The other end of the transfer transistor 1121, whose one end is electrically connected to the PD 111, is electrically connected to one end of each of the reset transistor 1122 and the amplifier transistor 1123.

The reset transistor 1122 resets the pixel 11b. A drive signal Vrd is applied as reset voltage to the other end of the reset transistor 1122 so that the pixel 11b is reset.

The amplifier transistor 1123 amplifies the analog voltage signals into which the FD region 112 has converted the electric charges output from the PD 111 through the transfer transistor 1121.

A color filter and a microlens are provided above the PD 111 where light strikes the PD 111. The color filter selects the wavelength bandwidth (the color) of the light striking the PD 111, and the microlens converges the striking light. Such color filter and microlens are included in each pixel. In some examples, such color filter and microlens may not be included in the pixels.

The configuration of each pixel of the pixel blocks 11 to 13 is similar to the configuration of the above-described pixel 11b, and the redundant description is omitted.

The analog memory 2 stores the analog voltage signals output from the pixels of the pixel blocks 11 to 13.

The ADC 3 converts the analog voltage signals from the analog memory 2 into the digital voltage signals through the A/D conversion and outputs the digital voltage signals. The ADC 3 is an example of the A/D converter.

The current source 4 supplies currents to drive the amplifier transistors of the pixel blocks 11 to 13.

If the analog memory 2 is disposed near the ADC 3, the wiring length from each pixel of the photoelectric conversion unit 1 to the analog memory 2 increases, which might hamper the amplifier transistor 1123 in each pixel from sufficiently amplifying the analog voltage signal. In view of such circumstances, in some examples, an additional amplifier circuit may be disposed between the photoelectric conversion unit 1 and the analog memory 2 so as to amplify the analog voltage signal from each pixel.

Figure 3:
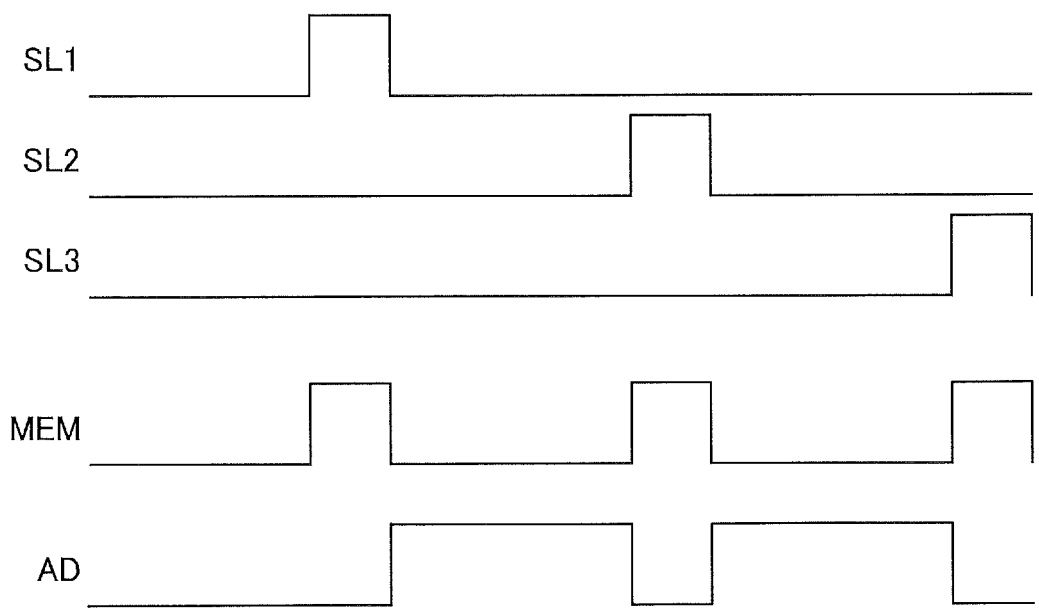
FIG. 3 is a timing chart of an operation example of the photoelectric conversion device according to the first embodiment.

Next, the operation of the photoelectric conversion device 300 is described with reference to FIG. 3. FIG. 3 is a timing chart for describing an example of the operation of the photoelectric conversion device 300. The signals illustrated in FIG. 3 refer to the timings at which elements of the pixel operate. In the following description, when a signal is high, the signal is ON. When a signal is low, the signal is OFF.

In FIG. 3, the signal SL1 indicates the timing at which the selecting switch 14 is turned on. Similarly, the signal SL2 indicates the timing at which the selecting switch 15 is turned on, and the signal SL3 indicates the timing at which the selecting switch 16 is turned on.

The signal MEM indicates the timings at which the analog voltage signals output from the pixels of the pixel blocks 11 to 13 are written in the analog memory 2. The signal AD indicates the timing at which the ADC 3 converts the analog voltage signal from the analog memory 2 into a digital signal through the A/D conversion.

As illustrated in FIG. 3, the signal MEM is turned on while the signal SL1 is ON. During that period, the analog voltage signals output from the pixels 11a and 11b in the pixel block 11 are written in the analog memory 2.

After that, the signal AD is turned on at the timing at which the signal MEM is turned off. At that timing, the ADC 3 reads the analog voltage signals output from the two pixels 11a and 11b, from the analog memory 2 storing the analog voltage signals and converts the analog voltage signals into the digital voltage signals through the A/D conversion. After the A/D conversion is completed, the digital voltage signals are output from the ADC 3.

At that timing at which the A/D conversion of the voltage signals from the pixels 11a and 11b is completed, the signal SL2 is turned on. The signal MEM is turned on while the signal SL2 is ON. During that period, the analog voltage signals output from the pixels 12a and 12b in the pixel block 12 are written in the analog memory 2.

After that, the signal AD is turned on at the timing at which the signal MEM is turned off. At that timing, the ADC 3 reads the analog voltage signals output from the two pixels 12a and 12b, from the analog memory 2 storing the analog voltage signals and converts the analog voltage signals into the digital voltage signals through the A/D conversion. After the A/D conversion is completed, the digital voltage signals are output from the ADC 3.

At that timing at which the A/D conversion of the voltage signals from the pixels 12a and 12b is completed, the signal SL3 is turned on. The signal MEM is turned on while the signal SL3 is ON. During that period, the analog voltage signals output from the pixels 13a and 13b in the pixel block 13 are written in the analog memory 2.

After that, the signal AD is turned on at the timing at which the signal MEM is turned off. At that timing, the ADC 3 reads the analog voltage signals output from the two pixels 13a and 13b, from the analog memory 2 storing the analog voltage signals and converts the analog voltage signals into the digital voltage signals through the A/D conversion. After the A/D conversion is completed, the digital voltage signals are output from the ADC 3.

In such a manner, the ADC 3 performs the A/D conversion via the analog memory 2. This enables a single ADC 3 alone to perform the A/D conversion on the analog voltage signals simultaneously output from the two pixels of each of the pixel blocks 11 to 13. In other words, the A/D conversion is performed on the analog voltage signals simultaneously output from the N pixels by the N−1 or less ADCs 3.

In the example of FIG. 3, one pixel outputs only the signal into which the light striking the PD 111 has been photoelectrically converted. No limitation, however, is intended therein. In some examples, it may be, for example, configured such that one pixel outputs two signals, such as a voltage signal (a reset signal) when the reset transistor 1122 is turned on and a signal photoelectrically converted from the electric charges of the PD 111.

The following describes specific examples of the arrangement and configuration of each element of the photoelectric conversion device 300. In the following description, some examples are given between which the number of pixels included in the photoelectric conversion unit 1 and the number of N, which is the number of pixels that simultaneously output the voltage signals, differ. Irrespective of difference in the number of pixels, the same reference numbers are assigned to elements having the same functions as those in the photoelectric conversion device 300.

FIG. 4 is an illustration of an example of the arrangement of the elements of the photoelectric conversion device 300. As illustrated in FIG. 4, the photoelectric conversion device 300 includes a photoelectric conversion unit 1, an analog memory 2, and an ADC 3.

The photoelectric conversion unit 1 includes K columns in the X direction and two rows in the Y direction indicated by arrows in FIG. 4, which are K×2 pixels in total. In the photoelectric conversion unit 1, two hatched pixels arranged in the Y direction constitute one pixel block. The two pixel of the pixel block simultaneously output analog voltage signals.

The analog memory 2 is disposed at the positive side relative to the photoelectric conversion unit 1 in the Y direction to be adjacent to the pixels arranged in the X direction. The ADC 3 is disposed at the positive side relative to the analog memory 2 in the Y direction to be adjacent to the analog memory 2 as a whole. In the example of FIG. 4, N is 2 (N=2), and (N−1) is 1 ((N−1)=1), which means that one ADC 3 is provided in the photoelectric conversion unit 1.

FIG. 5 is an illustration of another example of the arrangement of the elements of the photoelectric conversion device 300. The photoelectric conversion device 300 illustrated in FIG. 5 includes a photoelectric conversion unit 1, an analog memory 2, and an ADC 3, similarly to the example in FIG. 4.

The photoelectric conversion unit 1 includes K columns in the X direction and three rows in the Y direction indicated by arrows in FIG. 5, which are K×3 pixels in total. All the pixels in the first row are the pixels for the red to output the analog voltage signals in response to the incident light of the red, and all the pixels in the second row are the pixels for the green to output the analog voltage signals in response to the incident light of the green. Further, all the pixels in the third row are the pixels for the blue to output the analog voltage signals in response to the incident light of the blue color.

The hatched twelve pixels in four lows and three columns constitute one pixel block in the photoelectric conversion unit 1. The twelve pixels of the pixel block simultaneously output the analog voltage signals.

The analog memory 2 is disposed at the positive side relative to the photoelectric conversion unit 1 in the Y direction to be adjacent to the pixels arranged in the X direction. Eleven ADCs 3 are arranged in the X direction, at the positive side relative to the analog memory 2 in the Y direction to contact the analog memory 2 as a whole. In the example of FIG. 5, N is 12 (N=12), and N−1 is 11 (N−1=11), which means that eleven ADC 3 is provided in the photoelectric conversion unit 1.

FIGS. 6A and 6B are illustrations of the order in which the analog voltage signals are output in each pixel block, FIG. 6A illustrating a case of a photoelectric conversion device according to a comparative example and FIG. 6B illustrating a case of the photoelectric conversion device according to an embodiment of the present disclosure.

In both examples of FIGS. 6A and 6B, the photoelectric conversion unit includes eighteen pixels in total in six columns in the X direction and three rows in the Y direction. In each of FIGS. 6A and 6B, three photoelectric conversion units are arranged in the Y direction, corresponding to three different times. The photoelectric conversion unit in the upper stage corresponds to time T, the photoelectric conversion unit in the intermediate stage corresponds to time 2T, and the photoelectric conversion unit in the lower stage corresponds to time 3T.

In FIGS. 6A and 6B, "R" in pixels indicates a pixel for red to output an analog voltage signal corresponding to incident light of red color.

Further, "G" in pixels indicates a pixel for green to output an analog voltage signal corresponding to incident light of green color, and "B" in pixels indicates a pixel for blue to output an analog voltage signal corresponding to incident light of blue color. The numbers attached to "R", "G", and "B" indicate the column numbers of the pixels. The hatched pixels in FIGS. 6A and 6B indicate pixels to simultaneously output the analog voltage signals at the corresponding time of the three times T, 2T, and 3T.

In FIG. 6A, the hatched pixels R1, G1, B1, R4, G4, and B4 simultaneously output the analog voltage signals at time T. In this example, six pixels are included in one pixel block, and N is six (N=6).

Unhatched pixels that do not simultaneously output analog voltage signals are disposed between the pixel R1 and the pixel R4, the pixel G1 and the pixel G4, and the pixel B1 and the pixel B4. In other words, the pixels R1, G1, and B1 are not adjacent to the pixels R4, G4, and B4, respectively. The same applies to the other times 2T and 3T.

The hatched pixels R2, G2, B2, R5, G5, and B5 in FIG. 6A simultaneously output the analog voltage signals at time 2T. Further, the hatched pixels R3, G3, B3, R6, G6, and B6 in FIG. 6A simultaneously output the analog voltage signals at time 3T.

In FIG. 6B, the hatched pixels R1, R2, G1, G2, B1, and B2 simultaneously output the analog voltage signals at time T. In this example as well, N is 6 (N=6).

The pixels R1, G1, and B1 are adjacent to the pixels R2, G2, and B2. The same applies to the other times 2T and 3T.

The hatched pixels R3, R4, G3, G4, B3, and B4 in FIG. 6B simultaneously output the analog voltage signals at time 2T. Further, the hatched pixels R5, R6, G5, G6, B5, and B6 in FIG. 6B simultaneously output the analog voltage signals at time 3T.

The pixel block corresponding to time T is adjacent to the pixel block corresponding to time 2T, and the pixel block corresponding to time 2T is adjacent to the pixel block corresponding to time 3T.

There are some cases in which the photoelectric conversion device is used to capture an image, and a subject might be moving. Further, if the timing of outputting the analog voltage signal differs between the adjacent pixels in the photoelectric conversion device, gradations in color and brightness might occur in a captured image due to a sudden change in color and brightness.

The difference in the timing of outputting an analog voltage signal between the adjacent pixels is preferably as small as possible so as to avoid that situation.

In the example of FIG. 6A according to a comparative example, the pixel R4, for example, outputs the analog voltage signal at time T, and the pixel R3 outputs the analog voltage signal at time 3T. This means that the time difference between the adjacent pixels R4 and R3 is a time of 2T.

For the other pixels, the time difference between adjacent pixels is a time of 2T or less. Therefore, the difference in the time of outputting analog voltage signals between the adjacent pixels is 2T at maximum.

By contrast, in the example of FIG. 6B according to an embodiment of the present disclosure, adjacent pixels R1 and R2, for example, simultaneously output analog voltage signals, and accordingly, no time difference occurs between the adjacent pixels.

The pixel R2 outputs the analog voltage signal at time T, and the pixel R3 outputs the analog voltage signal at time 3T. In this case, the time difference between the adjacent pixels R2 and R3 is a time of T. Since the same applies to the other pixels, the difference in the time, at which analog voltage signals are output, between the adjacent pixels is T at maximum.

In the present embodiment, as illustrated in FIG. 6B, six pixels that simultaneously output analog voltage signals are adjacent to each other among the eighteen pixels. The six pixels of the pixel block corresponding to time T simultaneously output the analog voltage signals, and then, other six pixels, which are adjacent to the six pixels, included in the pixel block corresponding to time 2T simultaneously output the analog voltage signals at 2T.

The other six pixels, which are adjacent thereto, included in the pixel block corresponding to time 3T subsequently output the analog voltage signals simultaneously. Note that the pixel block corresponding to time T in FIG. 6B is an example of a first pixel block, and the pixel block corresponding to time 2T in FIG. 6B is an example of a second pixel block.

Such a configuration reduces the difference in the time of outputting analog voltage signals between adjacent pixels and prevents the occurrence of gradations in color and brightness in a captured image, unlike in the example of FIG. 6A.

FIGS. 7A and 7B are illustrations of examples of the arrangement of the ADC 3, FIG. 7A illustrating a case of a photoelectric conversion device 300' according to a comparative example and FIG. 7B illustrating a case of the photoelectric conversion device 300 according to an embodiment of the present disclosure.

As illustrated in FIG. 7A, the photoelectric conversion device 300' includes a photoelectric conversion unit 1' and an ADC 3'. The photoelectric conversion unit 1' and the ADC 3' are arranged side by side in the X direction indicated by arrow in FIG. 7A. In this example, although the distance between the ADC 3 and a pixel 11' at one end of the pixels, closest to the ADC 3' in the photoelectric conversion unit 1' is reduced, the distance between the ADC 3' and a pixel 12' at the other end of the pixels increases to substantially the same dimension of the photoelectric conversion unit 1' in the X direction.

Such a long distance to the ADC 3' leads to an increase in the wiring length to the ADC 3'. The increase in the wiring length adversely increases parasitic resistance and stray capacitance, which hampers the analog voltage signals from being accurately transmitted to the ADC 3'.

In the example of FIG. 7B, the photoelectric conversion device 300 includes a photoelectric conversion unit 1 and an ADC 3, and the photoelectric conversion unit 1 and the ADC 3 are arranged side by side in the Y direction indicated by arrow in FIG. 7B. In the photoelectric conversion unit 1 of FIG. 7B, one of the pixel blocks, in which the N pixels simultaneously output analog voltage signals, is sequentially selected from the pixel blocks in the X direction orthogonal to the Y direction.

In other words, in the example of FIG. 7B, the ADC 3 is disposed at one side (the positive side) of the pixel blocks in the Y direction orthogonal to the X direction in which one of the pixel blocks, in which the N pixels simultaneously output analog voltage signals, is sequentially selected the pixel blocks.

This arrangement enables the maximum distance between the ADC 3 and the pixels of the photoelectric conversion unit 1 in the Y direction to be half of the dimension of the photoelectric conversion unit 1 in the X direction, which is shorter than the dimension in the example of FIG. 7A. Consequently, the parasitic resistance and stray capacitance due to the length of the output wiring can be reduced, and thus, the analog voltage signals can be more accurately transmitted to the ADC 3.

Next, the adverse effects of an arrangement of the ADC 3 on crosstalk is described below.

Typical ADCs might fail to accurately perform A/D conversion if an input reference signal widely fluctuates to become invalid due to a significant change in an input signal to the ADCs.

Figure 8A:
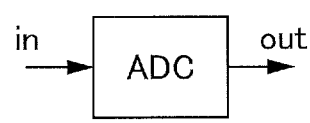
FIGS. 8A, 8B, 8C, and 8D are illustrations for describing a fluctuation in output value of the ADC, FIG. 8A illustrating an input to and an output from the ADC, FIG. 8B illustrating an example of an input signal, FIG. 8C illustrating a fluctuation in a reference signal, and FIG. 8D illustrating a fluctuation in an output signal due to the change in the reference signal.
Figure 8B:
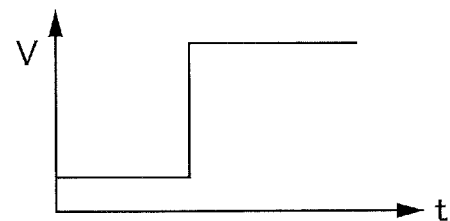
Figure 8C:
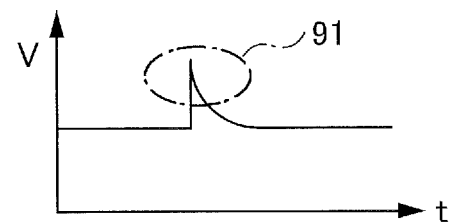
Figure 8D:
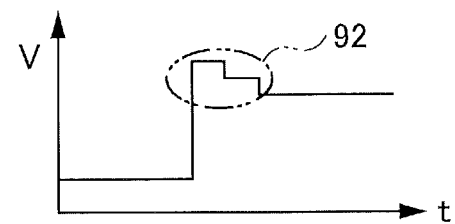

FIGS. 8A, 8B, 8C, and 8D are illustrations for describing a fluctuation in output value of the ADC, FIG. 8A illustrating an input to and an output from the ADC, FIG. 8B illustrating an example of an input signal, FIG. 8C illustrating a fluctuation in a reference signal, and FIG. 8D illustrating a fluctuation in an output signal due to the change in the reference signal;

Assuming that an analog voltage signal FIG. 8B is input to the ADC, and a reference signal fluctuates as indicated by chain line 91 in FIG. 8C, noise 92 occurs in a digital voltage signal into which the input analog voltage signal has been converted through A/D conversion, as indicated by chain double-dashed line in FIG. 8D.

It is, for example, assumed that the analog voltage signal output by a predetermined pixel R1 for the red in response to incident light of the red color is A/D converted, and the analog voltage signal output by a pixel G1 for the green adjacent to the pixel R1 is A/D converted. Then, the analog voltage signal output by a pixel R2 for the red in response to incident light of the red color is A/D converted, and the analog voltage signal output by a pixel G2 in response to incidence light of the green color is A/D converted.

In this case, the noise 92 that has occurred in the A/D conversion of the analog voltage signal from the pixel R1 affects the A/D conversion of the analog voltage signal from the pixel G1. Such an adverse effect is less likely to occur in the A/D conversion of the analog voltage signal from the pixel R2 following the A/D conversion of the analog voltage signal from the pixel R1, because the analog voltage signals from the pixels R1 and R2 have the same wavelength, and a change in brightness is small between the analog voltage signals of the same wavelength. In contrast, brightness significantly changes between the analog voltage signals of the different wavelengths as output from the pixels G1 and R1, and the A/D conversion of the analog voltage signal from the R1, which is performed after the A/D conversion of the analog voltage signal from the pixel G1, is particularly affected by the noise. In other words, crosstalk between colors becomes large accordingly.

Figure 9:
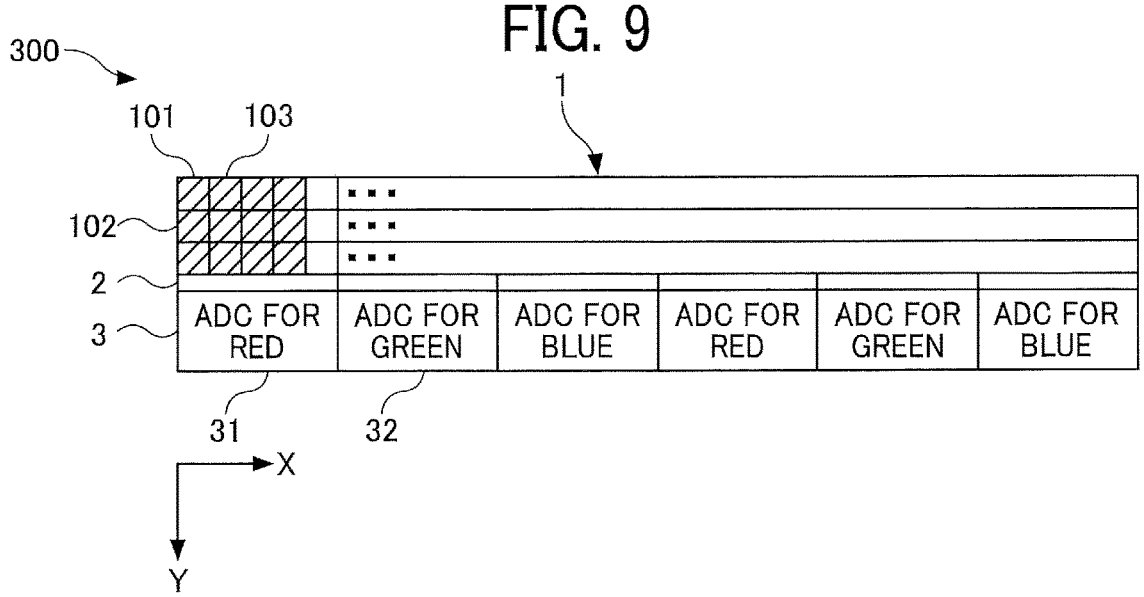
FIG. 9 is an illustration of another example arrangement of ADCs according to an embodiment of the present disclosure.

In an embodiment of the present disclosure, however, a plurality of ADCs 3 is prepared for the colors (the wavelength bandwidths) of incident light. FIG. 9 is an illustration of an example arrangement of ADCs prepared for different colors, according to an embodiment of the present disclosure.

The photoelectric conversion device 300 in FIG. 9 includes a photoelectric conversion unit 1, an analog memory 2, and ADCs 3. The analog memory 2 is disposed at the positive side relative to the photoelectric conversion unit 1 in the Y direction, and the ADCs 3 are arranged at the positive side relative to the analog memory 2 in the Y direction.

All the pixels in the first row of the photoelectric conversion unit 1 are pixels for red to output analog voltage signals in response to incident light of the red color. All the pixels in the second row are pixels for the green to output analog voltage signals in response to incident light of the green color, and all the pixels in the third row are pixels for the blue to output analog voltage signals in response to incident light of the blue color.

The ADCs 3 in FIG. 9 are an ADC for the red, an ADC for the green, an ADC for the blue, an ADC for the red, an ADC for the green, and an ADC for the blue arranged in the +X-direction. The ADCs for the red convert the analog voltage signals output from the pixels for the red through the analog memory 2. The ADCs for the green convert the analog voltage signals output from the pixels for the green through the analog memory 2. The ADCs for the blue convert the analog voltage signals output from the pixels for the blue through the analog memory 2.

In other words, a pixel 101 for the red of a plurality of pixels outputs an analog voltage signal to an ADC 31 for the red of a plurality of the ADCs 3, and a pixel 102 for the green of the plurality of pixels outputs an analog voltage signal to an ADC 32 for the green of the ADCs 3 in the photoelectric conversion unit 1.

The pixel 101 for the red is an example of the pixel that outputs a voltage signal output in response to incident light having a predetermined wavelength band, and the pixel 102 for the green is an example of the pixel that outputs a voltage signal output in response to incident light having a wavelength band different from the predetermined wavelength band. The ADC 31 for the red is an example of a first A/D converter, and the ADC 32 for the green is an example of a second A/D converter.

This configuration enables one ADC of the ADCs 3 to A/D convert only the analog voltage signals output from a pixel for one color, thus preventing the crosstalk between the colors.

In relation to the crosstalk between the colors, A/D conversion properties might change with the distance from a pixel to the ADC. The ADCs for the same wavelength bandwidth are preferably arranged adjacent to each other among a plurality of ADCs for the colors so as to deal with such an issue.

Figure 10:
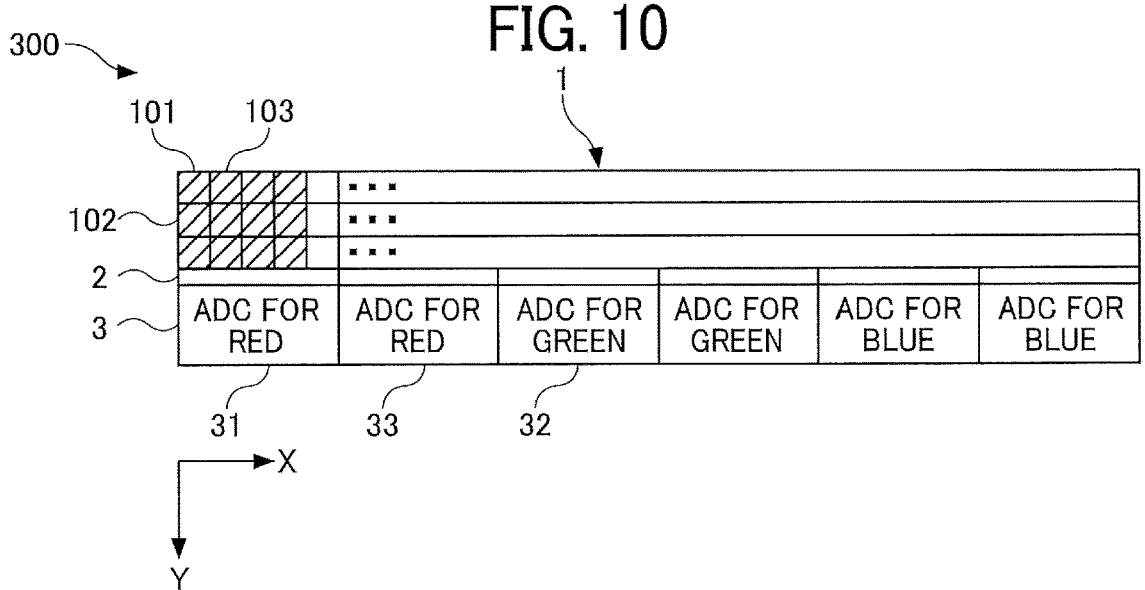
FIG. 10 is an illustration of still another example of the arrangement of the ADC according to an embodiment of the present disclosure.

FIG. 10 is an illustration of still another example of the arrangement of the ADCs in which ADCs for the same color are disposed adjacent to each other, according to an embodiment of the present disclosure. In the following description of FIG. 10, a redundant description of the same configuration as in FIG. 9 is omitted.

The ADCs 3 in FIG. 10 are an ADC for the red, an ADC for the red, an ADC for the green, an ADC for the green, an ADC for the blue, and an ADC for the blue arranged in the +X-direction.

A pixel 101 for the red of a plurality of pixels outputs an analog voltage signal to an ADC 31 for the red among a plurality of the ADCs 3, and a pixel 102 for the green of the plurality of pixels outputs an analog voltage signal to an ADC 32 for the green of the ADCs 3 in the photoelectric conversion unit 1.

A pixel 103 for the red out of the plurality of pixels outputs an analog voltage signal in response to incident light having the same wavelength bandwidth as the wavelength bandwidth of the pixel 101 for the red, toward an ADC 33 of the ADCs 3. The ADC 32 is not disposed between the ADC 31 and the ADC 33. In other words, the ADC 32 is disposed at a position other than a position between the ADC 31 and the ADC 33. The pixel 103 for the red is an example of the pixel that outputs a voltage signal in response to incident light having the same wavelength bandwidth as the predetermined wavelength bandwidth, and the ADC 33 is an example of a third A/D converter.

This arrangement, in which the ADCs for converting the signals output in response to incident light having the same wavelength bandwidth are disposed adjacent to each other, advantageously reduces a difference in the distance to a corresponding one of the ADCs, between the pixels for the same wavelength bandwidth (color). This configuration reduces or eliminates a difference in A/D conversion properties between the ADCs for the same color due to a difference in the distance from a pixel to a corresponding ADC.

Figure 11:
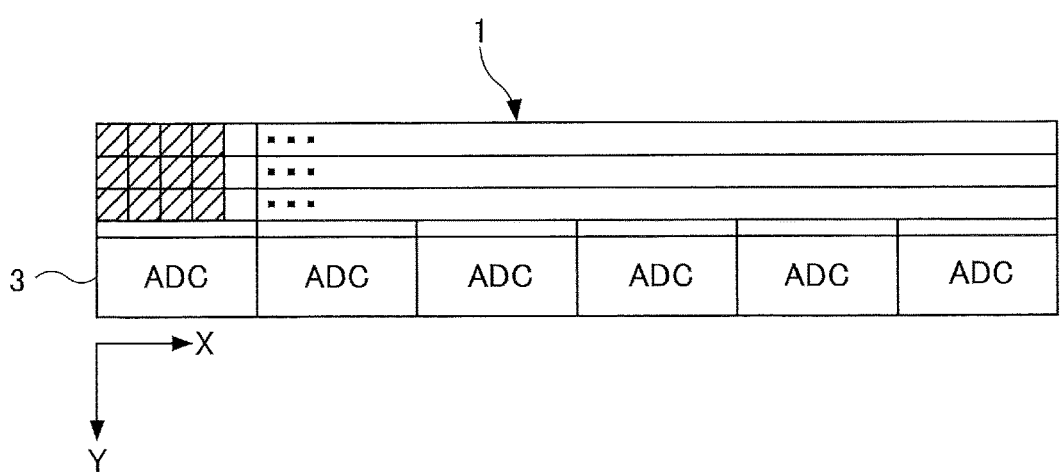
FIG. 11 is an illustration of an example of the number of ADCs of the photoelectric conversion device according to an embodiment of the present disclosure.

Next, FIG. 11 is an illustration of an example of the number of ADCs 3 in the photoelectric conversion device 300.

The photoelectric conversion device 300 in FIG. 11 includes six ADCs 3 and twelve pixels (N=12) that simultaneously output analog voltage signals. In other words, the number of ADCs 3 corresponds to a divisor of N.

When N is, for example, 12 (N=12), and ten ADCs 3, the number of which is not a divisor of N, is employed, eight of the ten ADCs 3 do not operate to perform A/D conversion during a period of time. Such ADCs are wasted.

In an embodiment of the present disclosure, the number of ADCs 3 is made a divisor of N to eliminate an ADC 3 that does not operate to perform A/D conversion during a period of time, thus improving the efficiency of A/D conversion.

Figure 12:
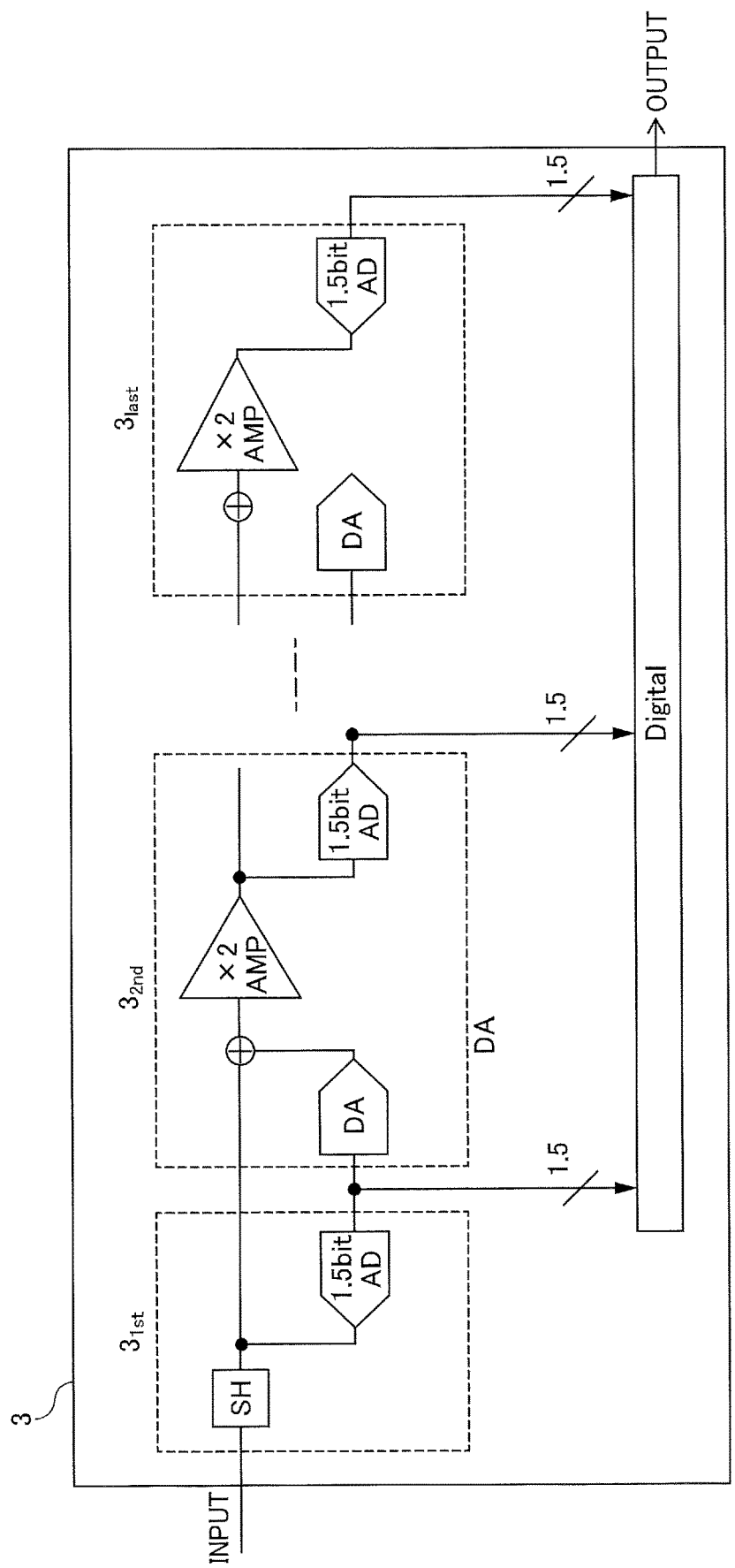
FIG. 12 is a diagram of an example of the circuit configuration of a pipeline ADC.

The photoelectric conversion device 300 according to an embodiment includes a pipeline ADC. The pipeline ADC includes a pipeline circuit provided with multistage ADCs each having a low resolution. FIG. 12 is a circuit diagram of the pipeline ADC according to an embodiment of the present disclosure.

The ADC 3 in FIG. 12 includes an ADC $3_{1st}$, an ADC $3_{2nd}$, . . . and an ADC $3_{last}$, which are multistage ADCs. An analog voltage signal is input to the ADC 3 from the left in FIG. 12, and the ADC $3_{1st}$, an ADC $3_{2nd}$, . . . and an ADC $3_{last}$ are sequentially A/D converted in that order through the pipeline operation. Then, a digital voltage signal after the A/D conversion is output from the right of the ADC 3 in FIG. 12.

Having the pipeline ADC enables the photoelectric conversion device 300 to perform the comparator function while maintaining the operation speed, which enables a high-speed operation. Such a configuration is particularly effective at A/D converting the analog voltage signals simultaneously output from the N pixels as in an embodiment of the present disclosure.

A sample hold circuit SH in FIG. 12 buffers an output from the preceding stage. Such a sample hold circuit may not be used in some examples. In some other examples, a fully-differential pipeline ADC is used to improve noise tolerance more effectively.

Figure 13:
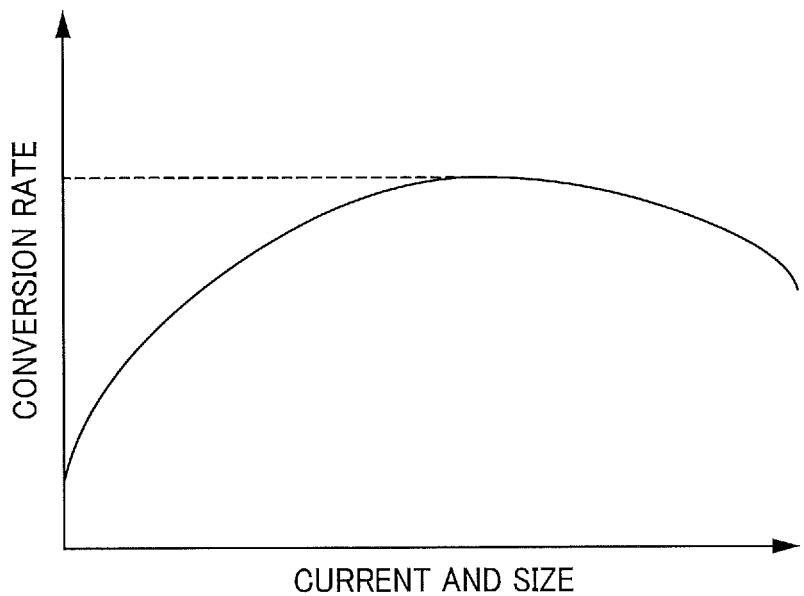
FIG. 13 is a graph for describing the relation of the conversion rate and the current and size of an internal amplifier.

The conversion speed of the ADC might depend on the current of an internal amplifier inside the ADC and the size of the elements of the amplifier. FIG. 13 is a graph for describing the relation of the conversion speed and the current and size of the internal amplifier.

As indicated in FIG. 13, when a load on the internal amplifier is small, the size of the elements of the internal amplifier within the ADC increases, and the conversion speed increases as the current of the internal amplifier increases. When the size of the elements, however, becomes too large, load on the internal amplifier itself becomes large, and the conversion speed decreases.

Typical ADCs of photoelectric conversion devices used for image capturing have a resolution of 8 binary digits (bits) to 16 bits, and one ADC with such a resolution has a conversion speed of several tens of megahertz (MHz) at maximum. The photoelectric conversion device 300 is preferably provided with an ADC having a conversion speed of several tens of MHz.

Figure 14A:
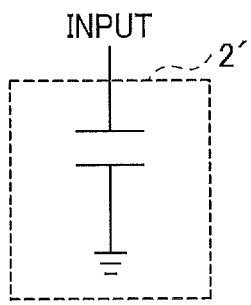
FIGS. 14A, 14B, and 14C are illustrations of examples of the configuration of an analog memory, FIG. 14 illustrating the configuration of an analog memory according to a comparative example, FIG. 14B illustrating an example configuration of an analog memory according to an embodiment of the present disclosure, and FIG. 14C illustrating an example configuration of the analog memory and the ADC according to an embodiment of the present disclosure.
Figure 14B:
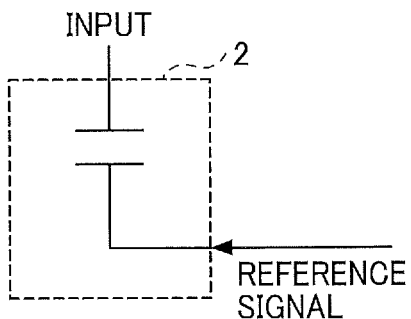
Figure 14C:
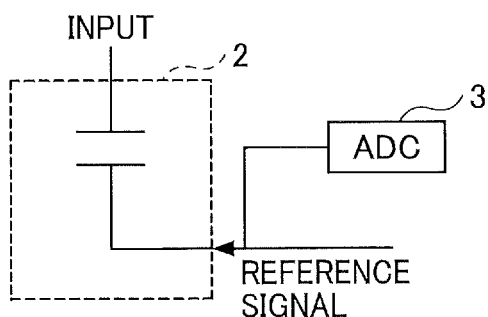

Next, the configuration of the analog memory 2 is described. FIGS. 14A, 14B, and 14C are illustrations of examples of the configuration of an analog memory, FIG. 14 illustrating the configuration of an analog memory according to a comparative example, FIG. 14B illustrating an example configuration of an analog memory according to an embodiment of the present disclosure, and FIG. 14C illustrating an example configuration of the analog memory and the ADC according to an embodiment of the present disclosure.

Noise might be superimposed on a source voltage and a GND voltage of an analog memory due to, for example, the current operating in an internal circuit. If an analog memory 2' is configured to hold a signal with reference to a source voltage and a GND voltage as illustrated in FIG. 14, a normal signal is not obtained due to noise.

In an embodiment of the present disclosure, an analog memory 2 in FIG. 14B is configured to hold a signal based on a reference signal generated by, for example, a band gap reference (BGR) so as to avoid such a situation. In the example of FIG. 14B, the analog memory 2 includes a capacitance, and no limitation, however, is intended therein. In another example, the analog memory 2 may include a transistor, which advantageously increase a retention volume per unit area.

FIG. 14C is a circuit diagram of another example configuration of the analog memory 2 in which the reference signal of the analog memory 2 and the reference voltage of the ADC 3 are shared. The configuration in FIG. 14C enables noise superimposed on the reference signal of the analog memory 2 to be cancelled out by noise superimposed on the reference signal of the ADC 3, which handles the issues caused by noise superimposed on the reference signal.

Photoelectric conversion devices are known that amplify photoelectrically-converted analog voltage signals and output analog-to-digital (A/D) signals. Apparatuses are also known that control a plurality of pixels to sequentially output analog voltage signals in a staggered manner and include an ADC shared by a plurality of columns of pixels.

Such apparatuses, however, have to employ the same number of ADCs as the number of pixels, which is N when N pixels are configured to simultaneously output analog voltage signals, and the area of the photoelectric conversion device might adversely increase. In such apparatuses, the photoelectric conversion device consumes more electricity as more ADCs are employed, and the conversion speed of the ADCs might decrease.

In the present embodiment, the analog voltage signals output from the plurality of pixels in response to incident light are temporarily stored in an analog memory and output to an ADC. This configuration enables A/D conversion without the same number of ADCs as the number of N pixels.

In other words, the analog voltage signals simultaneously output from N pixels are A/D converted with (N−1) ADCs. Such a reduction in the number of ADCs substantially prevents an increase in the area of the photoelectric conversion device 300, reduces power consumption of the photoelectric conversion device 300, and increases the conversion speed of the ADC.

In the present embodiment, N pixels are adjacent to each other among the plurality of pixels in the photoelectric conversion unit 1. The N pixels of the first pixel block simultaneously output analog voltage signals, and subsequently, the N pixels of the second pixel block adjacent to the first pixel block simultaneously output analog voltage signals. This configuration reduces or eliminates a difference in the time at which a pixel outputs an analog voltage signal, between adjacent pixels, which reduces or eliminates gradations in color and brightness within a captured image.

In the present embodiment, an ADC 3 is disposed at least one side of the photoelectric conversion unit 1 in a direction orthogonal to a direction in which one of the pixel blocks, in which the N pixels simultaneously output analog voltage signals, is sequentially selected from the pixel blocks.

This configuration enables the maximum distance from a pixel of the photoelectric conversion unit 1 to a corresponding ADC 3 to be half of the dimension of the photoelectric conversion unit 1 in the X direction. Consequently, the parasitic resistance and stray capacitance due to the length of the output wiring are reduced, and the analog voltage signals are more accurately transmitted to the ADC 3.

Further, in the present embodiment, a pixel of a plurality of pixels outputs an analog voltage signal in response to incident light having a predetermined wavelength bandwidth to a first ADC of the ADCs 3, and another pixel of the plurality of pixels outputs an analog voltage signal in response to incident light having a wavelength bandwidth different from the predetermined wavelength bandwidth to a second ADC different from the first ADC among the ADCs 3.

This configuration enables one ADC of the ADCs 3 to A/D convert only the analog voltage signals output from a pixel for one color, thus preventing the crosstalk between the colors.

Still further, in the present embodiment, a pixel of a plurality of pixels outputs an analog voltage signal in response to incident light having a predetermined wavelength bandwidth to a first ADC of the ADCs 3, and another pixel of the plurality of pixels outputs an analog voltage signal in response to incident light having a wavelength bandwidth different from the predetermined wavelength bandwidth to a second ADC different from the first ADC among the ADCs 3. Then, still another pixel of the plurality of pixels outputs an analog voltage signal in response to incident light having the same wavelength bandwidth as the predetermined wavelength bandwidth to a third ADC different from the first ADC among the ADCs 3.

The second ADC is not disposed between the first ADC and the third ADC. This arrangement, in which the ADCs for converting the signals output in response to incident light having the same wavelength bandwidth are disposed adjacent to each other, advantageously reduces a difference in the distance to a corresponding one of the ADCs, between the pixels for the same wavelength bandwidth (color). This configuration reduces or eliminates a difference in A/D conversion properties between the ADCs for the same color due to a difference in the distance from a pixel to a corresponding ADC.

Further, in the present embodiment, the number of ADCs corresponds to a divisor of the number (N) of pixels that simultaneously output analog voltage signals in the photoelectric conversion unit 1. This configuration eliminates an ADC 3 that does not operate to perform A/D conversion during a period of time, thus improving the efficiency of A/D conversion.

In the present embodiment, the ADC 3 is a pipeline ADC. This configuration enables the photoelectric conversion device 300 to perform the comparator function while maintaining the operation speed, which further enables a high-speed operation.

A photoelectric conversion device 300a according to a second embodiment is described.

In this embodiment, an amplification analog memory 5 (an analog memory for amplification) and L amplifiers 6 (amplifier circuits) are disposed between the photoelectric conversion unit 1 and an analog memory 2.

When the number of ADCs is M and the number of pixels, which simultaneously output analog voltage signals, in the photoelectric conversion unit 1 is N, N is greater than L, and L is greater than M (N>L>M). This configuration increases the sensitivity of the signals and enables more accurate A/D conversion while reducing or preventing upsizing of the photoelectric conversion device.

Figure 15:
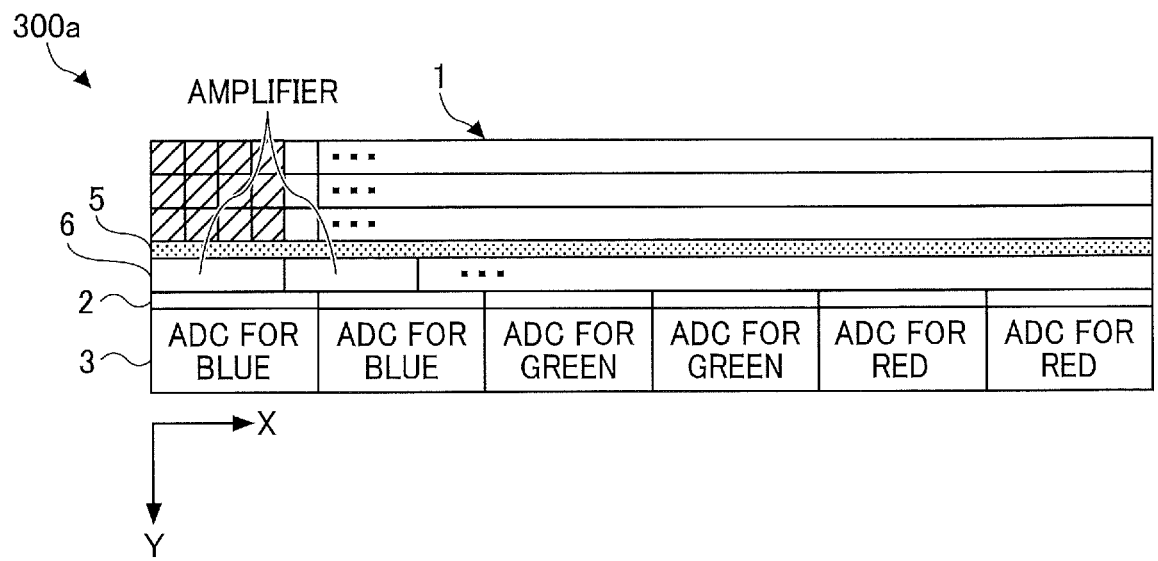
FIG. 15 is an illustration of an example of the arrangement of elements of a photoelectric conversion device according to a second embodiment.

FIG. 15 is an illustration of an example of the arrangement of elements of a photoelectric conversion device 300a. The photoelectric conversion device 300a in FIG. 15 includes a photoelectric conversion unit 1, an analog memory 2, an ADC 3, an amplification analog memory 5, and an amplifier 6.

The photoelectric conversion unit 1 includes K columns in the X direction and three rows in the Y direction indicated by arrows in FIG. 15, which are K×3 pixels in total. All the pixels in the first row are the pixels for the red to output the analog voltage signals in response to the incident light of the red, and all the pixels in the second row are the pixels for the green to output the analog voltage signals in response to the incident light of the green. Further, all the pixels in the third row are the pixels for the blue to output the analog voltage signals in response to the incident light of the blue.

The hatched N pixels constitute one pixel block in the photoelectric conversion unit 1, and the N pixels simultaneously output analog voltage signals.

The dotted amplification analog memory 5 is disposed at the positive side relative to the photoelectric conversion unit 1 in the Y direction so as to be adjacent to the pixels arranged in the X direction of the photoelectric conversion unit 1. The L amplifiers 6 arranged in the X direction are disposed at the positive side relative to the amplification analog memory 5 in the Y direction so as to be adjacent to the amplification analog memory 5 as a whole in the X direction.

The analog memory 2 is disposed at the positive side relative to the amplifiers 6 in the Y direction to be adjacent to all of the L amplifiers 6 arranged in the X direction. Further, on the positive Y direction side of the analog memory 2, M ADCs 3 arranged in the X direction are arranged so as to be adjacent to the entire X direction of the analog memory 2.

In other words, the amplification analog memory 5 and the L amplifiers 6 are disposed between the photoelectric conversion unit 1 and the analog memory 2 in the photoelectric conversion device 300*a*. In the example of FIG. 15, N is 12 (N=12), M is 6 (M=6), and L is a numerical value greater than 6 and less than 12. That is, N is greater than L, and L is greater than M (N>L>M).

The analog voltage signals output from the pixels of the photoelectric conversion unit 1 are amplified through the amplification analog memory 5 and the amplifiers 6, and the amplified signals are output to an analog memory 2. The signals are output from the analog memory 2 to the ADC 3 to be A/D converted.

Figure 16:
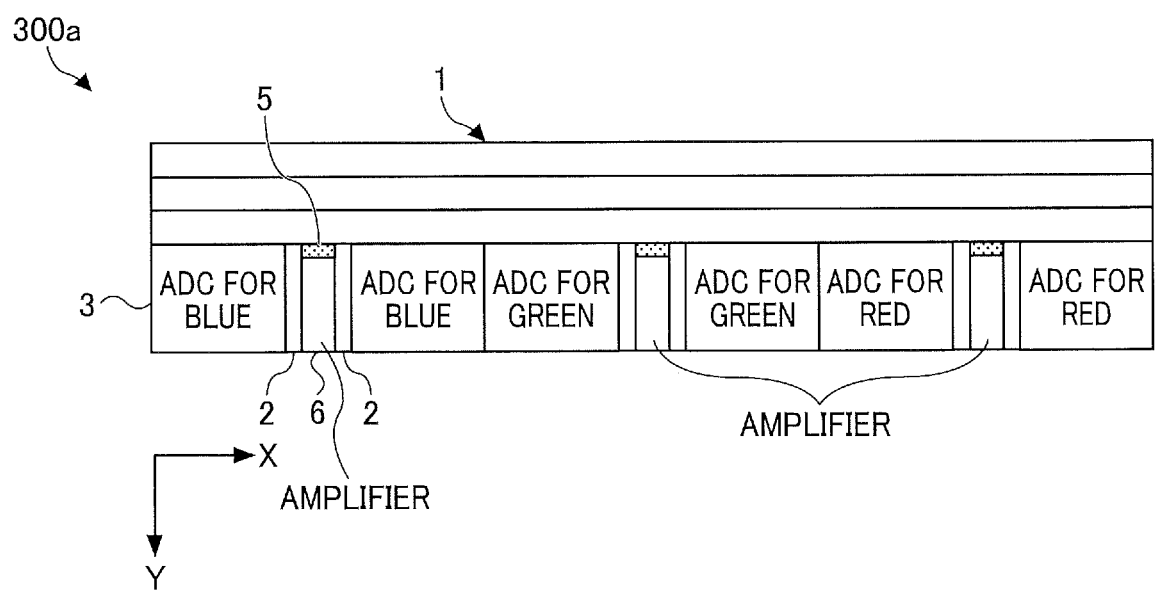
FIG. 16 is an illustration of another example of the arrangement of elements of the photoelectric conversion device according to the second embodiment.

FIG. 16 is an illustration of another example of the arrangement of elements of the photoelectric conversion device 300*a*. In the example of FIG. 16 similarly to the example of FIG. 15, the photoelectric conversion device 300*a* includes the photoelectric conversion unit 1, an analog memory 2, an ADC 3, an amplification analog memory 5, and an amplifier 6.

The photoelectric conversion unit 1 has the same configuration as in FIG. 15. The ADCs 3 for each color are arranged at the positive side relative to the photoelectric conversion unit 1 in the Y direction. Each set of an amplification analog memory 5 and an amplifier 6 is disposed between the two ADCs for the same color of all the ADCs arranged in the X direction. One set of an amplification analog memory 5 and an amplifier 6 is disposed between the two ADCs 3 for the blue, another set of an amplification analog memory 5 and an amplifier 6 is disposed between the two ADCs for the green, and still another set of an amplification analog memory 5 and an amplifiers 6 is disposed between the two ADCs 3 for the red.

This configuration is described in detailed below with reference to the ADCs 3 for the blue and elements around the ADCs for the blue. The dotted amplification analog memory 5 is adjacent to the photoelectric conversion unit 1 at the positive side relative to the photoelectric conversion unit 1 in the Y direction, and the amplifier 6 is adjacent to the amplification analog memory 5 at the positive side relative to the amplification analog memory 5 in the Y direction. The amplification analog memory 5 and the amplifier 6 are disposed between two analog memories 2 in the X direction. The amplification analog memory 5, the amplifier 6, and the two analog memories 2 are disposed between the two ADCs for the blue.

In the example of FIG. 16 as well, N is greater than L, and L is greater than M (N>L>M).

The analog voltage signals output from the pixels of the photoelectric conversion unit 1 are amplified through the amplification analog memory 5 and the amplifiers 6, and the amplified signals are output to the analog memories 2. The signals are output from the analog memories 2 to the ADCs 3 to be A/D converted.

Figure 17:
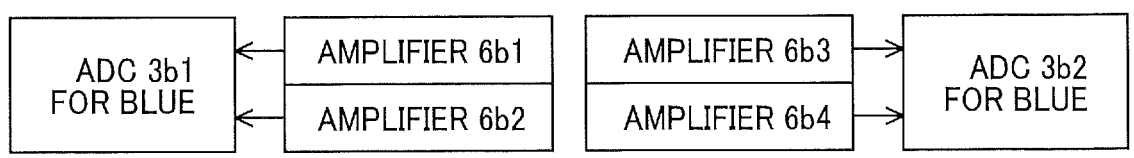
FIG. 17 is a block diagram of an example arrangement of amplifiers and ADCs for the blue according to an embodiment.

The following describes the operation of the photoelectric conversion device 300*a*. In the following description, an example case of the amplifiers 6*b*1 to 6*b*4 for the blue and the ADCs 3*b*1 and 3*b*2 for the blue of the photoelectric conversion device 300*a* in FIG. 17 is given. FIG. 17 is a block diagram of an example arrangement of the amplifiers 6*b*1 to 6*b*4 and the ADCs 3*b*1 and 3*b*2 for the blue according to an embodiment of the present disclosure. Some of the analog voltage signals from the pixels b0 to b31 for the blue are output from the amplifiers 6*b*1 and 6*b*2 to the ADC 3*b*1 for the blue, and the other analog voltage signals from the pixels b0 to b31 are output from the amplifiers 6*b*3 and 6*b*4 to the ADC 3*b*2 for the blue.

Figure 18:
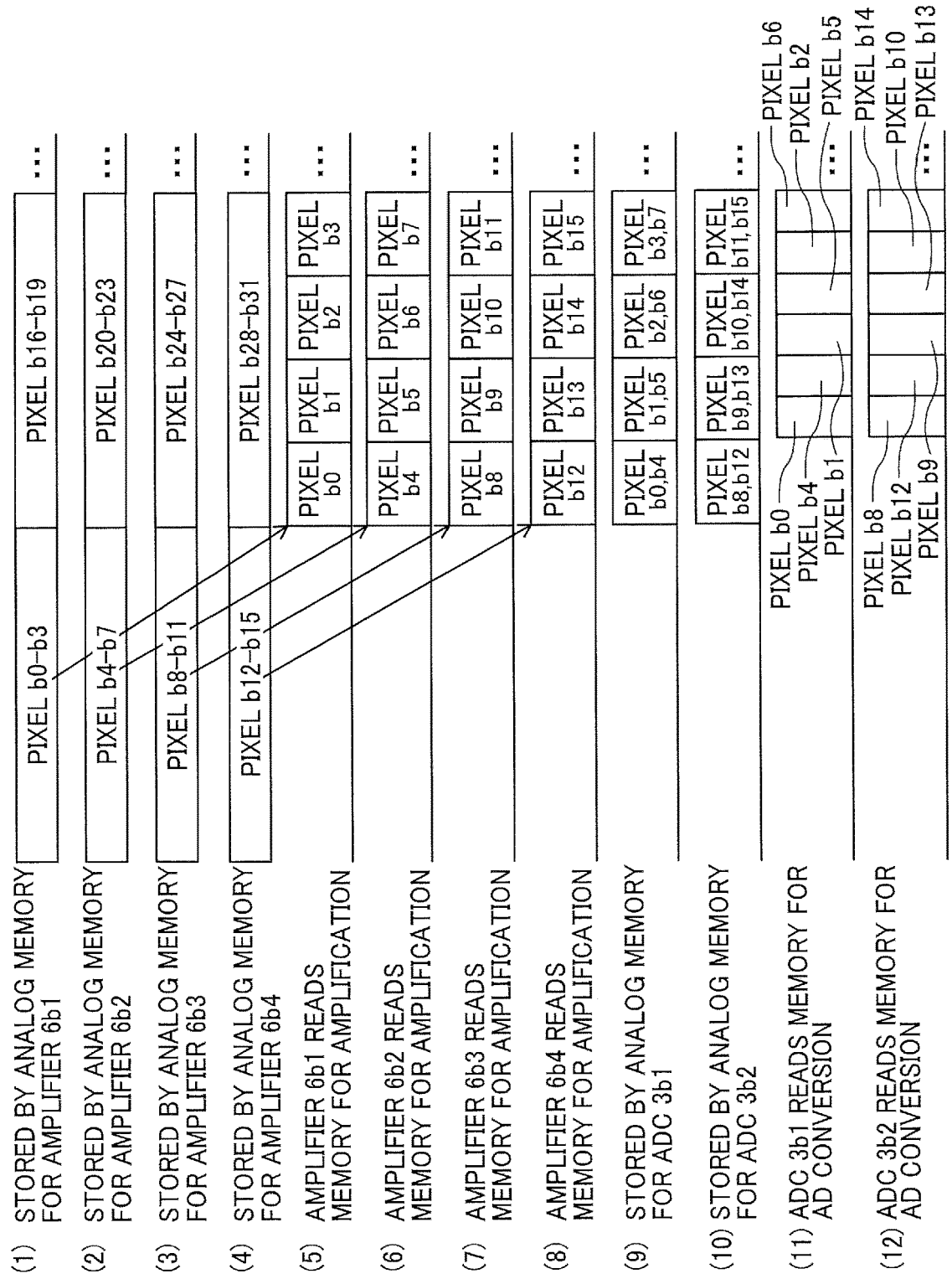
FIG. 18 is a timing chart for describing an example operation of the photoelectric conversion device according to the second embodiment.

FIG. 18 is a timing chart for describing an example operation of the photoelectric conversion device 300*a*.

In FIG. 18, the analog voltage signals simultaneously output from 16 pixels of the photoelectric conversion unit 1 are stored by four amplification analog memories 5, and the amplifiers 6*b*1 to 6*b*4 read the analog voltage signals from the four amplification analog memories 5 and amplify the analog voltage signals, respectively. Subsequently, the analog voltage signals simultaneously output from the amplifiers 6*b*1 to 6*b*4 are stored by two analog memories 2, and the ADCs 3*b*1 and 3*b*2 read the analog voltage signals from the analog memories 2 and A/D convert these analog voltage signals.

FIG. 18 indicates the signal processing timings of step (1) to step (12), which are listed from up to down. The list in FIG. 18 specifically includes the timings at which the amplifiers 6*b*1 to 6*b*4 and the ADCs 3*b*1 to 3*b*2 for the blue process the analog voltage signals output from the pixels b0 to b31 for the blue of the photoelectric conversion unit 1.

In step (1), the amplification analog memory 5 for the amplifier 6*b*1 stores the analog voltage signals output from the pixels b0 to b3 and the pixels b16 to b19.

In step (2) at the same timing as the timing of step (1), the amplification analog memory 5 for the amplifier 6*b*2 stores the analog voltage signals output from the pixels b4 to b7 and the pixels b20 to b23.

In step (3) at the same timing as the timings of steps (1) and (2), the amplification analog memory 5 for the amplifier 6*b*3 stores the analog voltage signals output from the pixels b8 to b11 and the pixels b24 to b27.

In step (4) at the same timing as the timings of steps (1), (2), and (3), the amplification analog memory 5 for the amplifier 6*b*4 stores the analog voltage signals output from the pixels b12 to b15 and the pixels b28 to b31.

Subsequently, in step (5) at the timing indicated in FIG. 18, the amplifier 6*b*1 reads, from the amplification analog memory 5, the analog voltage signals output from the pixels b0 to b3 and amplifies the analog voltage signals.

In step (6) at the same timing as the timing of step (5), the amplifier 6*b*2 reads, from the amplification analog memory 5, the analog voltage signals output from the pixels b4 to b7 and amplifies the analog voltage signals.

In step (7) at the same timing as the timings of steps (5) and (6), the amplifier 6*b*3 reads, from the amplification analog memory 5, the analog voltage signals output from the pixels b8 to b11 and amplifies the analog voltage signals.

In step (8) at the same timing as the timings of steps (5), (6), and (7), the amplifier 6*b*4 reads, from the amplification analog memory 5, the analog voltage signals output from the pixels b12 to b15 and amplifies the analog voltage signals.

In step (9) at the same time as the timings of steps (5), (6), (7), and (8), the analog memory 2 for the ADC 3*b*1 stores the analog voltage signals output from the pixels b0 and b4, the pixels b1 and b5, the pixels b2 and b6, and the pixels b3 and b7 and amplified by the amplifiers.

In step (10) at the same time as the timing of step (9), the analog memory 2 for the ADC 3b2 stores the analog voltage signals output from the pixels b8 and b12, the pixels b9 and b13, the pixels b10 and b14, and the pixels b11 and b15 and amplified by the amplifiers.

Subsequently, in step (11) at the timing indicated in FIG. 18, the ADC 3b1 reads, from the analog memory 2, the analog voltage signals output from the pixels b0, b4, b1, b5, b2, and b6 and amplified by the amplifiers and perform A/D conversion on the read analog voltage signals.

In step (12) at the same timing as the timing of step (11), the ADC 3b2 reads, from the analog memory 2, the analog voltage signals output from the pixels b8, b12, b9, b13, b10, and b14 and amplified by the amplifiers and performs A/D conversion on the read analog voltage signals.

Through the above-described steps, the photoelectric conversion device 300a performs A/D conversion on the analog voltage signals output from the pixels of the photoelectric conversion unit 1.

An example operation of the pixels for the blue is described with reference to FIGS. 17 and 18, and the same applies to pixels for the other colors, the red, the green, and the near-infrared color. The example of FIGS. 17 and 18 in which four amplifiers 6 and two ADCs 3 is only one example, and any desired number of amplifiers 6 and ADCs 3 may be used.

In the present embodiment, an amplification analog memory 5 and L amplifiers 6 are provided between the photoelectric conversion unit 1 and an analog memory 2, and the analog voltage signals output from the pixels of the photoelectric conversion unit 1 are amplified from several times to several hundred times to be A/D converted. This configuration enables more accurate A/D conversion while increasing the sensitivity of the signals.

Further, in the present embodiment, the amplification analog memory 5 is provided between the photoelectric conversion unit 1, and the number of amplifiers 6 is reduced so as to prevent upsizing of the photoelectric conversion device. In addition, more amplifiers 6 are used than the ADCs 3 to increase the speed of amplification because the amplifiers 6 have to amplify the signals from several times to several hundreds and are more difficult to speed up than the ADCs. In other words, when the number of ADCs is M and the number of pixels, which simultaneously output analog voltage signals, in the photoelectric conversion unit 1 is N, N is greater than L, and L is greater than M (N>L>M). This configuration reduces or prevents an increase in the area of the photoelectric conversion device and speeds up A/D conversion.

Further, N, M, and L are configured to be divisors or multiples for each other, for example, such that N is 24 (N=24), M is 6 (M=6), and L is 12 (L=12). This configuration eliminates an ADC 3 that does not operate to perform A/D conversion during a period of time, thus improving the efficiency of A/D conversion.

Advantageous effects other than those described above are similar to those described in the first embodiment.

A photoelectric conversion device 300b according to a third embodiment is described.

In the present embodiment, an ADC 3 is disposed at both sides of the photoelectric conversion unit 1 in a direction orthogonal to a direction in which one of the pixel blocks, in which N pixels simultaneously output analog voltage signals, is sequentially selected from the pixel blocks. This configuration reduces or prevents a change in electrical characteristics due to stress caused by bending of the photoelectric conversion device.

Figure 19:
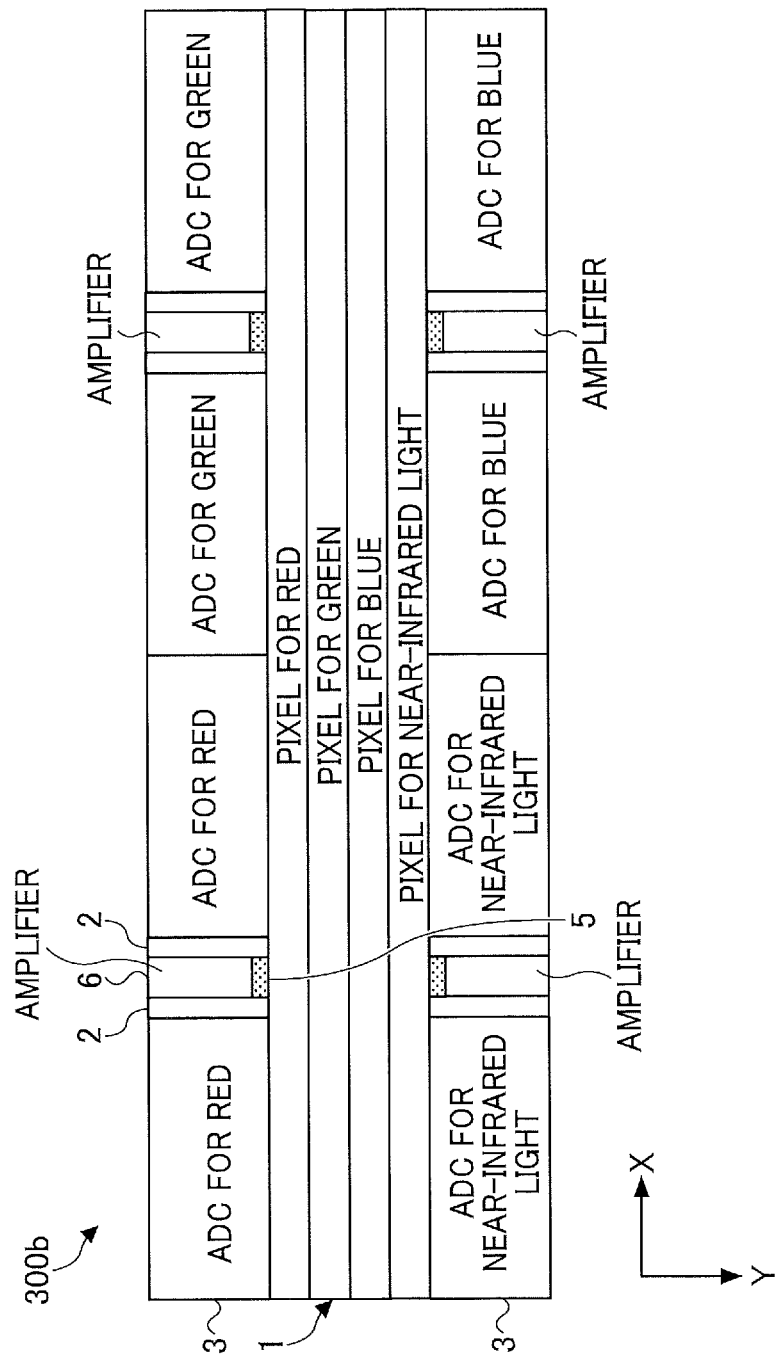
FIG. 19 is an illustration of an example of the arrangement of elements of the photoelectric conversion device according to a third embodiment.

FIG. 19 is an illustration of an example of the arrangement of elements of the photoelectric conversion device 300b. The photoelectric conversion device 300b in FIG. 19 includes a photoelectric conversion unit 1, an analog memory 2, an ADC 3, an amplification analog memory 5, and an amplifier 6.

The photoelectric conversion unit 1 includes K columns in the X direction and four rows in the Y direction indicated by arrows in FIG. 19, which are K×4 pixels in total. All the pixels in the first row are the pixels for the red to output the analog voltage signals in response to the incident light of the red, and all the pixels in the second row are the pixels for the green to output the analog voltage signals in response to the incident light of the green. All the pixels in the third row are pixels for the blue to output analog voltage signals in response to incident light of the green color, and all the pixels in the fourth row are pixels for the near-infrared color to output analog voltage signals in response to incident light of the near-infrared color.

The ADCs 3 for the red and the green are disposed at the negative side of the photoelectric conversion unit 1 in the Y direction, and the ADCs 3 for the near-infrared color and the blue are disposed at the positive side of the photoelectric conversion unit 1 in the Y direction. Each set of an amplification analog memory 5 and an amplifier 6 is disposed between the two ADCs for the same color of all the ADCs arranged in the X direction. One set of an amplification analog memory 5 and an amplifier 6 is disposed between the two ADCs 3 for the red, another set of an amplification analog memory 5 and an amplifier 6 is disposed between the two ADCs for the green, still another set of an amplification analog memory 5 and an amplifiers 6 is disposed between the two ADCs 3 for the blue, and yet another set of an amplification analog memory 5 and an amplifiers 6 is disposed between the two ADCs 3 for the near-infrared color.

In the example of 19, ADCs 3 are arranged at each side of the photoelectric conversion unit 1 in the Y direction. The X direction corresponds to the direction in which one of the pixel blocks, the N pixels simultaneously output analog voltage signals, is sequentially selected from the pixel blocks, and the Y direction corresponds to the direction orthogonal to the direction in which one of the pixel blocks, in which N pixels simultaneously output analog voltage signals, is sequentially selected from the pixel blocks. In other words, the ADCs 3 are arranged at each side of the photoelectric conversion unit 1 in the direction orthogonal to the direction in which one of the pixel blocks, in which the N pixels simultaneously output analog voltage signals, is sequentially selected from the pixel blocks.

This configuration is described in detailed below with reference to the ADCs 3 for the red and elements around the ADCs for the red. The dotted amplification analog memory 5 is adjacent to the photoelectric conversion unit 1 at the negative side relative to the photoelectric conversion unit 1 in the Y direction, and the amplifier 6 is adjacent to the amplification analog memory 5 at the negative side relative to the amplification analog memory 5 in the Y direction. The amplification analog memory 5 and the amplifier 6 are disposed between two analog memories 2 in the X direction. The amplification analog memory 5, the amplifier 6, and the two analog memories 2 are disposed between the two ADCs for the red.

The analog voltage signals output from the pixels of the photoelectric conversion unit 1 are amplified through the amplification analog memory 5 and the amplifiers 6, and the amplified signals are output to the analog memories 2. The signals are output from the analog memories 2 to the ADCs 3 to be A/D converted.

Figure 20:
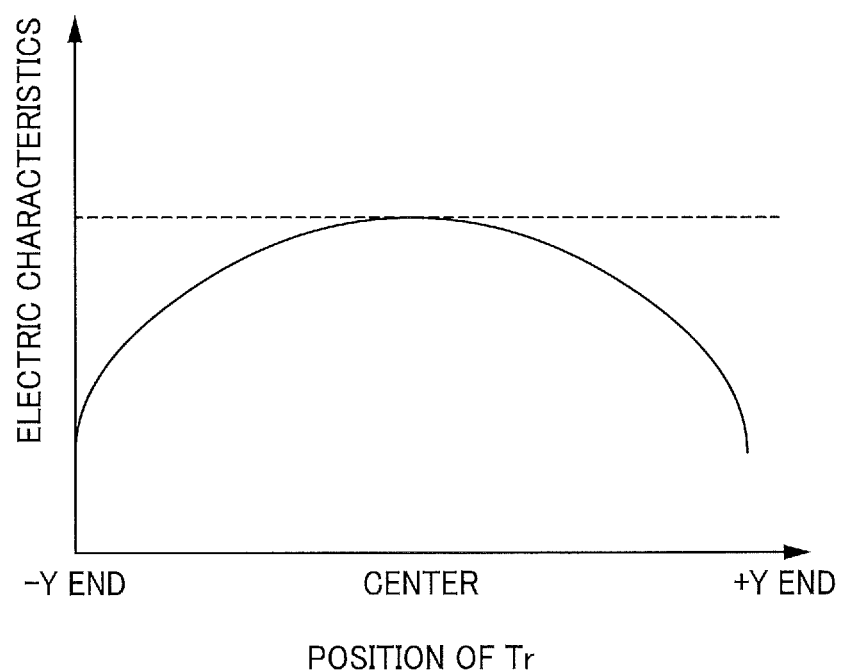
FIG. 20 is a graph for describing the relation of electrical characteristics and a position of a transistor in the photoelectric conversion device.

FIG. 20 is a graph for describing the relation of electrical characteristics and the position of a transistor in the photoelectric conversion device. As illustrated in FIG. 20, electrical characteristics, such as a voltage threshold (Vth) of the transistor, might change when the transistor is disposed at the negative-side end or positive-side end of the photoelectric conversion device in the Y direction, unlike when the transistor is disposed at the center of the photoelectric conversion device.

In the present embodiment, ADC 3s are disposed at each side of the photoelectric conversion unit 1 in a direction orthogonal to a direction in which one of the pixel block, in which the N pixels simultaneously output analog voltage signals, is sequentially selected from the pixel blocks. This configuration, in which the photoelectric conversion device 300*b* is disposed at a position other than the ends of the photoelectric conversion device 300*b*, reduces or prevents a change in electrical characteristics due to stress caused by bending of the photoelectric conversion device 300*b*. This enables more accurate output of an analog voltage signal in response to incident light.

Advantageous effects other than those described above are similar to those described in the first and second embodiments.

An image reading device 400 according to a fourth embodiment is described below. In the present disclosure, the image reading device 400 is an example of a scanner.

Figure 21:
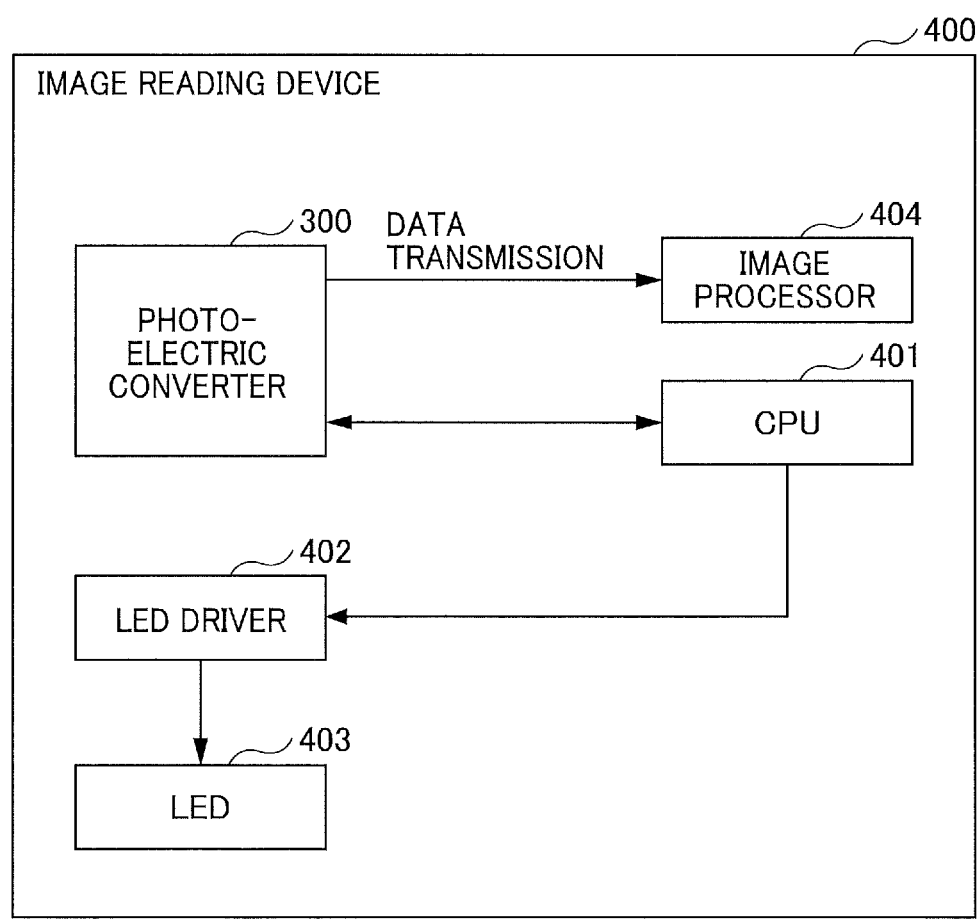
FIG. 21 is a block diagram of an example configuration of an image reading device according to a fourth embodiment.

FIG. 21 is a block diagram of an example of the configuration of the image reading device 400. The image reading device 400 in FIG. 21 includes a photoelectric conversion device 300, a central processing unit (CPU) 401, a light emitting diode driver 402, an LED 403, and image processor 404.

The CPU 401 is a processor that controls the entire operation of the image reading device 400. The LED driver 402 is an electric circuit that drives the LED 403 to emit light to a document, such as a sheet of paper, under control of the CPU 401.

The photoelectric conversion device 300 receives and A/D converts the light reflected from the document irradiated with the light from the LED 403 to generate a digital voltage signal, and transmits, as image data read from the document, the generated digital voltage signal to the image processor 404.

The image processor 404 is an electronic circuit that performs various correction processes on the image data transmitted from the photoelectric conversion device 300.

Incorporating the photoelectric conversion device 300 according to an embodiment reduces or prevents upsizing of the image reading device 400. Incorporating the photoelectric conversion device 300 also enables the image reading device 400 to speed up A/D conversion while reducing power consumption.

An image forming apparatus 500 according to a fifth embodiment is described. In the present disclosure, the image forming apparatus 500 is an example of a multifunction peripherals (MFP) or a printer.

Figure 22:
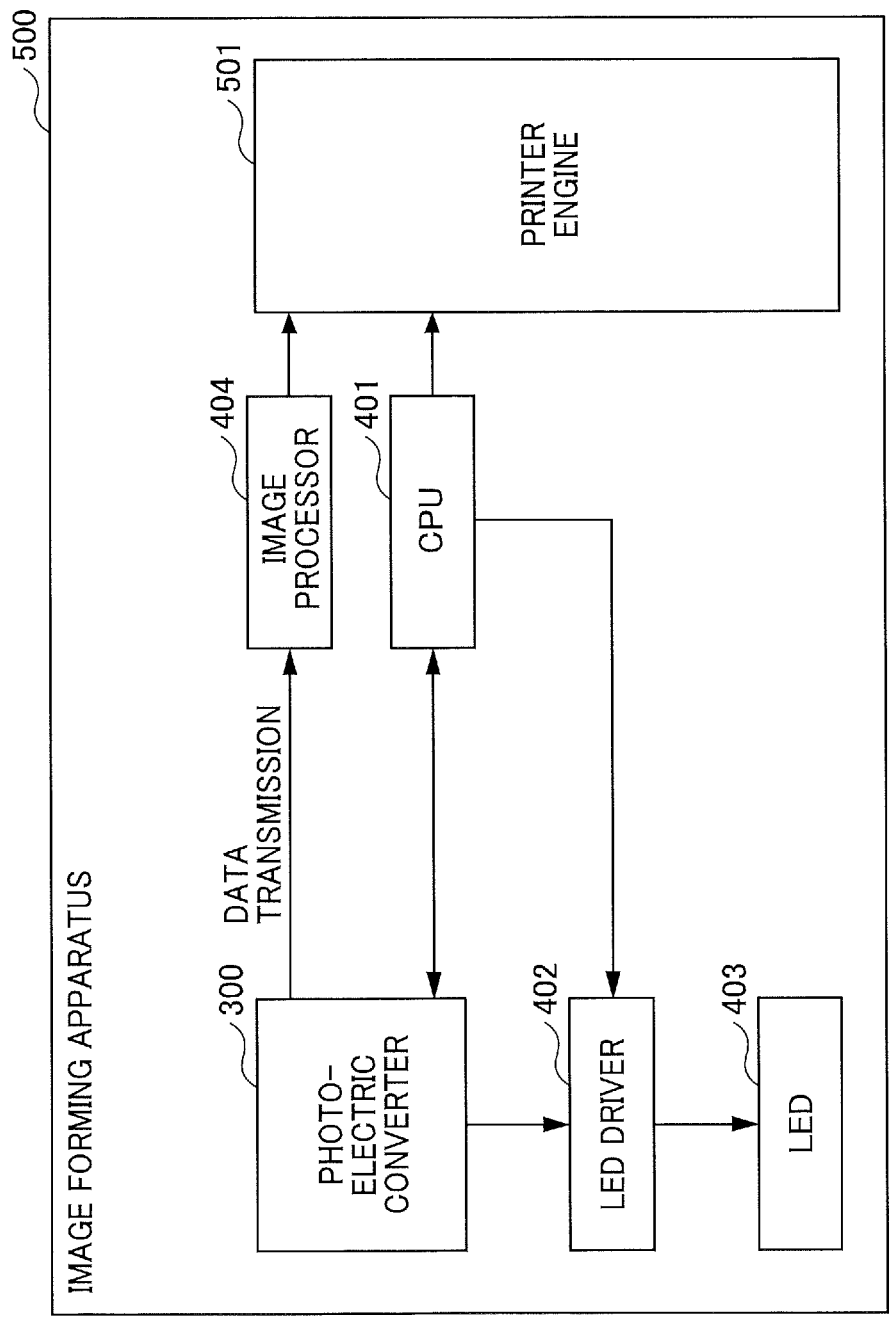
FIG. 22 is a block diagram of an example configuration of an image forming apparatus according to a fifth embodiment.

FIG. 22 is a block diagram of an example configuration of the image forming apparatus 500. The image forming apparatus in FIG. 22 includes a printer engine 501, a photoelectric conversion device 300, a CPU 401, an LED driver 402, an LED 403, and an image processor 404.

The photoelectric conversion device 300, the CPU 401, the LED driver 402, the LED 403, and the image processor 404 are the same as those described with reference to FIG. 21, and redundant description is omitted.

The printer engine 501 receives the image data read by the photoelectric conversion device 300 via the image processor 404. The printer engine 501 forms an image on a recording medium, such as a sheet of paper, based on the image data under the control of the CPU 401.

In the present embodiment, incorporating the photoelectric conversion device 300 reduces or prevents upsizing of the image forming apparatus 500. Incorporating the photoelectric conversion device 300 also enables the image reading apparatus 500 to speed up A/D conversion while reducing power consumption.

Although the present disclosure makes reference to specific embodiments, it is to be noted that the present disclosure is not limited to the details of the embodiments described above. Thus, various modifications and enhancements are possible in light of the above teachings, without departing from the scope of the present disclosure. It is therefore to be understood that the present disclosure may be practiced otherwise than as specifically described herein. For example, elements and/or features of different embodiments may be combined with each other and/or substituted for each other within the scope of the present disclosure. The number of constituent elements and their locations, shapes, and so forth are not limited to any of the structure for performing the methodology illustrated in the drawings.

The photoelectric conversion devices 300, 300*a*, and 300*b* include lines of pixels for the red, green, blue, and near infrared colors, and each line functions as a line sensor.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A photoelectric conversion device comprising:
   a plurality of pixels configured to output analog voltage signals in response to incident light;
   an analog memory configured to store the analog voltage signals output from the plurality of pixels;
   an analog/digital (A/D) converter configured to perform A/D conversion on the analog voltage signals from the analog memory; and
   a photoelectric conversion unit including the plurality of pixels,
   the plurality of pixels including N pixels configured to simultaneously output analog voltage signals to the analog memory, and
   the A/D converter including (N−1) or less A/D converters configured to perform A/D conversion on the analog voltage signals that have been simultaneously output from the N pixels and stored in the analog memory;
   wherein the plurality of pixels includes pixel blocks each including the N pixels that simultaneously output analog voltage signals, and
   the A/D converter is disposed at at least one side of the photoelectric conversion unit in a direction orthogonal to a direction in which one of the pixel blocks, in which the N pixels simultaneously output analog voltage signals, is sequentially selected from the pixel blocks.

2. The photoelectric conversion device according to claim 1, wherein
the pixel blocks include a first pixel block and a second pixel block adjacent to the first pixel block, each of the first pixel block and the second pixel block including the N pixels, the N pixels of the plurality of pixels are adjacent to each other, and
the N pixels of the first pixel block simultaneously output analog voltage signals before the N pixels of the second pixel block simultaneously output analog voltage signals.

3. The photoelectric conversion device according to claim 1, wherein
the A/D converter includes a first A/D converter and a second A/D converter different from the first A/D converter,
a pixel of the plurality of pixels is configured to output an analog voltage signal in response to incident light having a predetermined wavelength bandwidth, to the first A/D converter, and
another pixel of the plurality of pixels is configured to output an analog voltage signal in response to incident light having a wavelength bandwidth different from the predetermined wavelength bandwidth, to the second A/D converter.

4. The photoelectric conversion device according to claim 1, wherein
the number of A/D converters is a divisor of the number of N.

5. The photoelectric conversion device according to claim 1, wherein
the A/D converter is a pipeline A/D converter.

6. The photoelectric conversion device according to claim 1,
wherein
the A/D converter is disposed at each side of the photoelectric conversion unit in a direction orthogonal to a direction in which one of the pixel blocks simultaneously output analog voltage signals, is sequentially selected from the pixel blocks.

7. A line sensor comprising:
the photoelectric conversion device according to claim 1.

8. An image reading device comprising:
the photoelectric conversion device according to claim 1.

9. An image forming apparatus comprising:
the photoelectric conversion device according to claim 1.

10. A photoelectric conversion device comprising:
a plurality of pixels configured to output analog voltage signals in response to incident light;
an analog memory configured to store the analog voltage signals output from the plurality of pixels; and
an analog/digital (A/D) converter configured to perform A/D conversion on the analog voltage signals from the analog memory,
the plurality of pixels including N pixels configured to simultaneously output analog voltage signals to the analog memory, and
the A/D converter including (N−1) or less A/D converters configured to perform A/D conversion on the analog voltage signals that have been simultaneously output from the N pixels and stored in the analog memory, wherein
the A/D converter includes a first A/D converter, a second A/D converter, and a third A/D converter,
the second A/D converter is disposed at a position other than a position between the first A/D converter and the third A/D converter,
a pixel of the plurality of pixels is configured to output an analog voltage signal in response to incident light having a predetermined wavelength bandwidth, to the first A/D converter,
another pixel of the plurality of pixels is configured to output an analog voltage signal in response to incident light having a wavelength bandwidth different from the predetermined wavelength bandwidth, to the second A/D converter, and
still another pixel of the plurality of pixels is configured to output an analog voltage signal in response to incident light having the same wavelength bandwidth as the predetermined wavelength bandwidth, to the third A/D converter.

11. A photoelectric conversion device comprising:
a plurality of pixels configured to output analog voltage signals in response to incident light;
an analog memory configured to store the analog voltage signals output from the plurality of pixels;
an analog/digital (A/D) converter configured to perform A/D conversion on the analog voltage signals from the analog memory;
a photoelectric conversion unit including the plurality of pixels;
an analog memory for amplification; and
amplifier circuits in the number of L,
the plurality of pixels including N pixels configured to simultaneously output analog voltage signals to the analog memory,
the A/D converter including (N−1) or less A/D converters configured to perform A/D conversion on the analog voltage signals that have been simultaneously output from the N pixels and stored in the analog memory, and
the analog memory for amplification and the L amplifier circuits being disposed between the analog memory and the photoelectric conversion unit,
wherein N is greater than L, and L is greater than M when the number of A/D conversions is M.

12. The photoelectric conversion device according to claim 11, wherein
the numbers of N, L, and M are divisors or multiples for each other.

* * * * *